(12) United States Patent
Mignard et al.

(10) Patent No.: US 7,550,810 B2
(45) Date of Patent: Jun. 23, 2009

(54) MEMS DEVICE HAVING A LAYER MOVABLE AT ASYMMETRIC RATES

(75) Inventors: Marc Mignard, San Jose, CA (US); Lior Kogut, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 25 days.

(21) Appl. No.: 11/360,162

(22) Filed: Feb. 23, 2006

(65) Prior Publication Data

US 2007/0194630 A1    Aug. 23, 2007

(51) Int. Cl.
*H01L 49/00*    (2006.01)
(52) U.S. Cl. .................. 257/419; 257/415; 257/417; 345/85; 359/239
(58) Field of Classification Search .............. 257/415, 257/417, 419; 345/85; 359/239
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,728,030 A | 4/1973 | Hawes | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |
| 4,377,324 A | 3/1983 | Durand et al. | |
| 4,389,096 A | 6/1983 | Hori et al. | |

(Continued)

FOREIGN PATENT DOCUMENTS

DE    4108966 A1    9/1992

(Continued)

OTHER PUBLICATIONS

Akasaka, "Three-Dimensional IC Trends", Proceedings of IEEE, vol. 74, No. 12, pp. 1703-1714, (Dec. 1986).

(Continued)

*Primary Examiner*—Allan R. Wilson
(74) *Attorney, Agent, or Firm*—Knobbe, Martens, Olson & Bear, LLP

(57) ABSTRACT

A microelectromechanical (MEMS) device includes a substrate and a movable layer mechanically coupled to the substrate. The movable layer moves from a first position to a second position at a first rate and from the second position to the first position at a second rate faster than the first rate. The MEMS device further includes an adjustable cavity defined between the substrate and the movable layer and containing a fluid. The MEMS device further includes a fluid conductive element through which the fluid flows at a first flowrate from inside the cavity to outside the cavity upon movement of the movable layer from the second position to the first position and through which the fluid flows at a second flowrate slower than the first flowrate from outside the cavity to inside the cavity upon movement of the movable layer from the first position to the second position.

30 Claims, 19 Drawing Sheets

U.S. PATENT DOCUMENTS

| | | |
|---|---|---|
| 4,392,711 A | 7/1983 | Moraw et al. |
| 4,403,248 A | 9/1983 | te Velde |
| 4,441,791 A | 4/1984 | Hornbeck |
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,666,254 A | 5/1987 | Itoh et al. |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,857,978 A | 8/1989 | Goldburt et al. |
| 4,859,060 A | 8/1989 | Katagiri et al. |
| 4,895,500 A * | 1/1990 | Hok et al. .................. 417/566 |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,091,983 A | 2/1992 | Lukosz |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,315,370 A | 5/1994 | Bulow |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,365 A | 4/1997 | Rhoades et al. |

| | | | | | | |
|---|---|---|---|---|---|---|
| 5,619,366 A | 4/1997 | Rhoads et al. | | 6,282,010 B1 | 8/2001 | Sulzbach et al. |
| 5,629,790 A | 5/1997 | Neukermans et al. | | 6,286,935 B1 * | 9/2001 | Silverbrook ................ 347/54 |
| 5,633,652 A | 5/1997 | Kanbe et al. | | 6,288,472 B1 | 9/2001 | Cabuz et al. |
| 5,636,052 A | 6/1997 | Arney et al. | | 6,288,824 B1 | 9/2001 | Kastalsky |
| 5,636,185 A | 6/1997 | Brewer et al. | | 6,295,154 B1 | 9/2001 | Laor et al. |
| 5,638,084 A | 6/1997 | Kalt | | 6,323,982 B1 | 11/2001 | Hornbeck |
| 5,638,946 A | 6/1997 | Zavracky | | 6,327,071 B1 | 12/2001 | Kimura |
| 5,641,391 A | 6/1997 | Hunter et al. | | 6,331,909 B1 | 12/2001 | Dunfield |
| 5,646,729 A | 7/1997 | Koskinen et al. | | 6,335,831 B2 | 1/2002 | Kowarz et al. |
| 5,646,768 A | 7/1997 | Kaeiyama | | 6,356,254 B1 | 3/2002 | Kimura |
| 5,650,881 A | 7/1997 | Hornbeck | | 6,356,378 B1 | 3/2002 | Huibers |
| 5,654,741 A | 8/1997 | Sampsell et al. | | 6,358,021 B1 | 3/2002 | Cabuz |
| 5,657,099 A | 8/1997 | Doherty et al. | | 6,376,787 B1 | 4/2002 | Martin et al. |
| 5,659,374 A | 8/1997 | Gale, Jr. et al. | | 6,384,952 B1 | 5/2002 | Clark et al. |
| 5,661,591 A | 8/1997 | Lin et al. | | 6,407,851 B1 | 6/2002 | Islam et al. |
| 5,661,592 A | 8/1997 | Bornstein et al. | | 6,417,868 B1 | 7/2002 | Bock herald Reinhart et al. |
| 5,665,997 A | 9/1997 | Weaver et al. | | 6,433,917 B1 | 8/2002 | Mei et al. |
| 5,673,139 A | 9/1997 | Johnson | | 6,438,282 B1 | 8/2002 | Takeda et al. |
| 5,683,591 A | 11/1997 | Offenberg | | 6,447,126 B1 | 9/2002 | Hornbeck |
| 5,703,710 A | 12/1997 | Brinkman et al. | | 6,449,084 B1 | 9/2002 | Guo |
| 5,710,656 A | 1/1998 | Goosen | | 6,452,712 B2 | 9/2002 | Atobe et al. |
| 5,726,480 A | 3/1998 | Pister | | 6,456,420 B1 | 9/2002 | Goodwin-Johansson |
| 5,739,945 A | 4/1998 | Tayebati | | 6,465,355 B1 | 10/2002 | Horsley |
| 5,740,150 A | 4/1998 | Uchimaru et al. | | 6,466,190 B1 | 10/2002 | Evoy |
| 5,745,193 A | 4/1998 | Urbanus et al. | | 6,466,354 B1 | 10/2002 | Gudeman |
| 5,745,281 A | 4/1998 | Yi et al. | | 6,466,358 B2 | 10/2002 | Tew |
| 5,751,469 A | 5/1998 | Arney et al. | | 6,473,072 B1 | 10/2002 | Comiskey et al. |
| 5,771,116 A | 6/1998 | Miller et al. | | 6,473,274 B1 | 10/2002 | Maimone et al. |
| 5,784,190 A | 7/1998 | Worley | | 6,480,177 B2 | 11/2002 | Doherty et al. |
| 5,784,212 A | 7/1998 | Hornbeck | | 6,496,122 B2 | 12/2002 | Sampsell |
| 5,786,927 A | 7/1998 | Greywall et al. | | 6,545,335 B1 | 4/2003 | Chua et al. |
| 5,793,504 A | 8/1998 | Stoll | | 6,548,908 B2 | 4/2003 | Chua et al. |
| 5,808,780 A | 9/1998 | McDonald | | 6,549,338 B1 | 4/2003 | Wolverton et al. |
| 5,808,781 A | 9/1998 | Arney et al. | | 6,552,840 B2 | 4/2003 | Knipe |
| 5,818,095 A | 10/1998 | Sampsell | | 6,574,033 B1 | 6/2003 | Chui et al. |
| 5,825,528 A | 10/1998 | Goosen | | 6,589,625 B1 | 7/2003 | Kothari et al. |
| 5,835,255 A | 11/1998 | Miles | | 6,597,490 B2 | 7/2003 | Tayebati |
| 5,838,484 A | 11/1998 | Goossen et al. | | 6,600,201 B2 | 7/2003 | Hartwell et al. |
| 5,842,088 A | 11/1998 | Thompson | | 6,606,175 B1 | 8/2003 | Sampsell et al. |
| 5,867,302 A | 2/1999 | Fleming | | 6,608,268 B1 | 8/2003 | Goldsmith |
| 5,905,482 A | 5/1999 | Hughes et al. | | 6,624,944 B1 | 9/2003 | Wallace et al. |
| 5,912,758 A | 6/1999 | Knipe et al. | | 6,625,047 B2 | 9/2003 | Coleman, Jr. |
| 5,943,158 A | 8/1999 | Ford et al. | | 6,630,786 B2 | 10/2003 | Cummings et al. |
| 5,959,763 A | 9/1999 | Bozler et al. | | 6,632,698 B2 | 10/2003 | Ives |
| 5,986,796 A | 11/1999 | Miles | | 6,635,919 B1 | 10/2003 | Melendez et al. |
| 5,994,174 A | 11/1999 | Carey et al. | | 6,643,069 B2 | 11/2003 | Dewald |
| 6,028,689 A | 2/2000 | Michalicek et al. | | 6,650,455 B2 | 11/2003 | Miles |
| 6,028,690 A | 2/2000 | Carter et al. | | 6,657,832 B2 | 12/2003 | Williams et al. |
| 6,038,056 A | 3/2000 | Florence et al. | | 6,660,656 B2 | 12/2003 | Cheung et al. |
| 6,040,937 A | 3/2000 | Miles | | 6,661,561 B2 | 12/2003 | Fitzpatrick et al. |
| 6,046,840 A | 4/2000 | Huibers | | 6,666,561 B1 | 12/2003 | Blakley |
| 6,049,317 A | 4/2000 | Thompson et al. | | 6,674,090 B1 | 1/2004 | Chua et al. |
| 6,055,090 A | 4/2000 | Miles | | 6,674,562 B1 | 1/2004 | Miles et al. |
| 6,056,406 A | 5/2000 | Park et al. | | 6,674,563 B2 | 1/2004 | Chui et al. |
| 6,061,075 A | 5/2000 | Nelson et al. | | 6,680,792 B2 | 1/2004 | Miles |
| 6,097,145 A | 8/2000 | Kastalsky et al. | | 6,698,295 B1 | 3/2004 | Sherrer |
| 6,099,132 A | 8/2000 | Kaeriyama | | 6,710,908 B2 | 3/2004 | Miles et al. |
| 6,100,872 A | 8/2000 | Aratani et al. | | 6,741,377 B2 | 5/2004 | Miles |
| 6,113,239 A | 9/2000 | Sampsell et al. | | 6,741,383 B2 | 5/2004 | Huibers et al. |
| 6,147,790 A | 11/2000 | Meier et al. | | 6,741,384 B1 | 5/2004 | Martin et al. |
| 6,158,156 A | 12/2000 | Patrick | | 6,741,503 B1 | 5/2004 | Farris et al. |
| 6,160,833 A | 12/2000 | Floyd et al. | | 6,747,785 B2 | 6/2004 | Chen et al. |
| 6,171,945 B1 | 1/2001 | Mandal et al. | | 6,747,800 B1 | 6/2004 | Lin |
| 6,172,797 B1 | 1/2001 | Huibers | | 6,775,174 B2 | 8/2004 | Huffman et al. |
| 6,180,428 B1 | 1/2001 | Peeters et al. | | 6,778,155 B2 | 8/2004 | Doherty et al. |
| 6,195,196 B1 | 2/2001 | Kimura et al. | | 6,794,119 B2 | 9/2004 | Miles |
| 6,201,633 B1 | 3/2001 | Peeters et al. | | 6,809,788 B2 | 10/2004 | Yamada et al. |
| 6,215,221 B1 | 4/2001 | Cabuz et al. | | 6,811,267 B1 | 11/2004 | Allen et al. |
| 6,227,824 B1 * | 5/2001 | Stehr .......................... 417/540 | | 6,819,469 B1 | 11/2004 | Koba |
| 6,232,936 B1 | 5/2001 | Gove et al. | | 6,822,628 B2 | 11/2004 | Dunphy et al. |
| 6,239,777 B1 | 5/2001 | Atsushi et al. | | 6,829,132 B2 | 12/2004 | Martin et al. |
| 6,243,149 B1 | 6/2001 | Swanson et al. | | 6,841,081 B2 | 1/2005 | Chang et al. |
| 6,261,066 B1 | 7/2001 | Linnemann et al. | | 6,853,129 B1 | 2/2005 | Cummings et al. |

| | | | | | |
|---|---|---|---|---|---|
| 6,855,610 B2 | 2/2005 | Tung et al. | 2004/0125281 A1 | 7/2004 | Lin et al. |
| 6,859,218 B1 | 2/2005 | Luman et al. | 2004/0125282 A1 | 7/2004 | Lin et al. |
| 6,861,277 B1 | 3/2005 | Monroe et al. | 2004/0125347 A1 | 7/2004 | Patel et al. |
| 6,862,022 B2 | 3/2005 | Slupe | 2004/0136045 A1 | 7/2004 | Tran |
| 6,862,029 B1 | 3/2005 | D'Souza et al. | 2004/0140557 A1 | 7/2004 | Yi-Sheng et al. |
| 6,867,896 B2 | 3/2005 | Miles | 2004/0145049 A1 | 7/2004 | McKinnell et al. |
| 6,870,581 B2 | 3/2005 | Li et al. | 2004/0145811 A1 | 7/2004 | Lin et al. |
| 6,870,654 B2 | 3/2005 | Lin et al. | 2004/0147056 A1 | 7/2004 | McKinnell et al. |
| 6,882,458 B2 | 4/2005 | Lin et al. | 2004/0147198 A1 | 7/2004 | Lin et al. |
| 6,882,461 B1 | 4/2005 | Tsai et al. | 2004/0148009 A1 | 7/2004 | Buzzard et al. |
| 6,891,658 B2 | 5/2005 | Whitehead et al. | 2004/0150939 A1 | 8/2004 | Huff |
| 6,912,022 B2 | 6/2005 | Lin et al. | 2004/0160143 A1 | 8/2004 | Shreeve et al. |
| 6,940,630 B2 | 9/2005 | Xie | 2004/0174583 A1 | 9/2004 | Chen et al. |
| 6,947,200 B2 | 9/2005 | Huibers | 2004/0175577 A1 | 9/2004 | Lin et al. |
| 6,952,303 B2 | 10/2005 | Lin et al. | 2004/0179281 A1 | 9/2004 | Reboa |
| 6,958,847 B2 | 10/2005 | Lin | 2004/0179445 A1 | 9/2004 | Park et al. |
| 6,959,990 B2 | 11/2005 | Penn | 2004/0184766 A1 | 9/2004 | Kim et al. |
| 6,980,350 B2 | 12/2005 | Hung et al. | 2004/0201908 A1 | 10/2004 | Kaneko |
| 7,008,812 B1 | 3/2006 | Carley | 2004/0207897 A1 | 10/2004 | Lin |
| 7,053,737 B2 | 5/2006 | Schwartz et al. | 2004/0209192 A1 | 10/2004 | Lin et al. |
| 7,075,700 B2 | 7/2006 | Muenter | 2004/0209195 A1 | 10/2004 | Lin |
| 7,123,216 B1 | 10/2006 | Miles | 2004/0212026 A1 | 10/2004 | Van Brooklin et al. |
| 7,236,284 B2 | 6/2007 | Miles | 2004/0217378 A1 | 11/2004 | Martin et al. |
| 7,372,613 B2 | 5/2008 | Chui et al. | 2004/0217919 A1 | 11/2004 | Pichi et al. |
| 7,372,619 B2 | 5/2008 | Miles | 2004/0218251 A1 | 11/2004 | Piehi et al. |
| 7,385,762 B2 | 6/2008 | Cummings | 2004/0218334 A1 | 11/2004 | Martin et al. |
| 2001/0003487 A1 | 6/2001 | Miles | 2004/0218341 A1 | 11/2004 | Martin et al. |
| 2001/0028503 A1 | 10/2001 | Flanders et al. | 2004/0227493 A1 | 11/2004 | Van Brocklin et al. |
| 2001/0043171 A1 | 11/2001 | Van Gorkom et al. | 2004/0233503 A1 | 11/2004 | Kimura |
| 2002/0014579 A1 | 2/2002 | Dunfield | 2004/0240032 A1 | 12/2004 | Miles |
| 2002/0015215 A1 | 2/2002 | Miles | 2004/0240138 A1 | 12/2004 | Martin et al. |
| 2002/0021485 A1 | 2/2002 | Pilossof | 2004/0245588 A1 | 12/2004 | Nikkel et al. |
| 2002/0024711 A1 | 2/2002 | Miles | 2004/0263944 A1 | 12/2004 | Miles et al. |
| 2002/0027636 A1 | 3/2002 | Yamada | 2005/0001828 A1 | 1/2005 | Martin et al. |
| 2002/0054424 A1 | 5/2002 | Miles | 2005/0002082 A1 | 1/2005 | Miles |
| 2002/0075555 A1 | 6/2002 | Miles | 2005/0003667 A1 | 1/2005 | Lin et al. |
| 2002/0114558 A1 | 8/2002 | Nemirovsky | 2005/0014374 A1 | 1/2005 | Partridge et al. |
| 2002/0126364 A1 | 9/2002 | Miles | 2005/0024557 A1 | 2/2005 | Lin |
| 2002/0139981 A1 | 10/2002 | Young | 2005/0035699 A1 | 2/2005 | Tsai |
| 2002/0146200 A1 | 10/2002 | Kurdle et al. | 2005/0036095 A1 | 2/2005 | Yeh et al. |
| 2002/0149828 A1 | 10/2002 | Miles | 2005/0036192 A1 | 2/2005 | Lin et al. |
| 2002/0149850 A1 | 10/2002 | Heffner et al. | 2005/0038950 A1 | 2/2005 | Adelmann |
| 2002/0167072 A1 | 11/2002 | Andosca | 2005/0042117 A1 | 2/2005 | Lin |
| 2002/0167730 A1 | 11/2002 | Needham et al. | 2005/0046919 A1 | 3/2005 | Taguchi et al. |
| 2002/0186483 A1 | 12/2002 | Hagelin et al. | 2005/0046922 A1 | 3/2005 | Lin et al. |
| 2003/0015936 A1 | 1/2003 | Yoon et al. | 2005/0046948 A1 | 3/2005 | Lin |
| 2003/0016428 A1 | 1/2003 | Kato et al. | 2005/0057442 A1 | 3/2005 | Way |
| 2003/0029705 A1 | 2/2003 | Qui et al. | 2005/0068583 A1 | 3/2005 | Gutkowski et al. |
| 2003/0035196 A1 | 2/2003 | Walker | 2005/0068605 A1 | 3/2005 | Tsai |
| 2003/0043157 A1 | 3/2003 | Miles | 2005/0068606 A1 | 3/2005 | Tsai |
| 2003/0053078 A1 | 3/2003 | Missey et al. | 2005/0069209 A1 | 3/2005 | Damera-Vankata et al. |
| 2003/0072070 A1 | 4/2003 | Miles | 2005/0078348 A1 | 4/2005 | Lin |
| 2003/0156315 A1 | 8/2003 | Li et al. | 2005/0157364 A1 | 7/2005 | Lin |
| 2003/0202264 A1 | 10/2003 | Weber et al. | 2005/0168849 A1 | 8/2005 | Lin |
| 2003/0202265 A1 | 10/2003 | Reboa et al. | 2005/0179378 A1 | 8/2005 | Oooka et al. |
| 2003/0202266 A1 | 10/2003 | Ring et al. | 2005/0195462 A1 | 9/2005 | Lin |
| 2003/0210851 A1 | 11/2003 | Fu et al. | 2005/0195467 A1 | 9/2005 | Kothari et al. |
| 2004/0008396 A1 | 1/2004 | Stappaerts | 2005/0202649 A1 | 9/2005 | Hung et al. |
| 2004/0008438 A1 | 1/2004 | Akinobu | 2005/0249966 A1 | 11/2005 | Tung et al. |
| 2004/0027671 A1 | 2/2004 | Wu et al. | 2005/0275932 A1 | 12/2005 | Islam et al. |
| 2004/0027701 A1 | 2/2004 | Ishikawa | 2006/0007517 A1 | 1/2006 | Tsai |
| 2004/0043552 A1 | 3/2004 | Strumpell et al. | 2006/0017379 A1 | 1/2006 | Su et al. |
| 2004/0051929 A1 | 3/2004 | Sampsell et al. | 2006/0024880 A1 | 2/2006 | Chui et al. |
| 2004/0056742 A1 | 3/2004 | Dabbaj | 2006/0033975 A1 | 2/2006 | Miles |
| 2004/0058532 A1 | 3/2004 | Miles et al. | 2006/0044654 A1 | 3/2006 | Vandorpe et al. |
| 2004/0070400 A1 | 4/2004 | Van Spengen | 2006/0065940 A1 | 3/2006 | Kothari |
| 2004/0075967 A1 | 4/2004 | Lynch et al. | 2006/0066599 A1 | 3/2006 | Chui |
| 2004/0080035 A1 | 4/2004 | Delapierre | 2006/0066640 A1 | 3/2006 | Kothari et al. |
| 2004/0080807 A1 | 4/2004 | Chen et al. | 2006/0066641 A1 | 3/2006 | Gally et al. |
| 2004/0100594 A1 | 5/2004 | Huibers et al. | 2006/0066926 A1 | 3/2006 | Chui et al. |
| 2004/0100677 A1 | 5/2004 | Huibers et al. | 2006/0066935 A1 | 3/2006 | Cummings |
| 2004/0100680 A1 | 5/2004 | Huibers et al. | 2006/0067643 A1 | 3/2006 | Chui |
| 2004/0124483 A1 | 7/2004 | Partridge et al. | 2006/0067649 A1 | 3/2006 | Tung et al. |

| | | | |
|---|---|---|---|
| 2006/0067651 A1 | 3/2006 | Chui | |
| 2006/0077152 A1 | 4/2006 | Chui et al. | |
| 2006/0077155 A1 | 4/2006 | Chui et al. | |
| 2006/0077156 A1 | 4/2006 | Chui et al. | |
| 2006/0077507 A1 | 4/2006 | Chui et al. | |
| 2006/0077508 A1 | 4/2006 | Chui et al. | |
| 2006/0077515 A1 | 4/2006 | Cummings | |
| 2006/0077516 A1 | 4/2006 | Kothari | |
| 2006/0077527 A1 | 4/2006 | Cummings | |
| 2006/0077533 A1 | 4/2006 | Miles et al. | |
| 2006/0079048 A1 | 4/2006 | Sampsell | |
| 2006/0139723 A9 | 6/2006 | Miles | |
| 2006/0220160 A1 | 10/2006 | Miles | |
| 2006/0262126 A1 | 11/2006 | Miles | |
| 2006/0262380 A1 | 11/2006 | Miles | |
| 2006/0268388 A1 | 11/2006 | Miles | |
| 2006/0274074 A1 | 12/2006 | Miles | |
| 2006/0274398 A1 | 12/2006 | Chou | |
| 2007/0040777 A1 | 2/2007 | Cummings | |
| 2007/0121118 A1 | 5/2007 | Galley et al. | |
| 2007/0177247 A1 | 8/2007 | Miles | |
| 2008/0013144 A1 | 1/2008 | Chui et al. | |
| 2008/0013145 A1 | 1/2008 | Chui et al. | |
| 2008/0013154 A1 | 1/2008 | Chui | |
| 2008/0037093 A1 | 2/2008 | Miles | |
| 2008/0055705 A1 | 3/2008 | Kothari | |
| 2008/0055706 A1 | 3/2008 | Chui et al. | |
| 2008/0080043 A1 | 4/2008 | Chui et al. | |
| 2008/0088904 A1 | 4/2008 | Miles | |
| 2008/0088911 A1 | 4/2008 | Miles | |
| 2008/0088912 A1 | 4/2008 | Miles | |
| 2008/0106782 A1 | 5/2008 | Miles | |
| 2008/0110855 A1 | 5/2008 | Cummings | |
| 2008/0112035 A1 | 5/2008 | Cummings | |
| 2008/0112036 A1 | 5/2008 | Cummings | |

FOREIGN PATENT DOCUMENTS

| | | |
|---|---|---|
| DE | 10228946 A1 | 1/2004 |
| EP | 0 310 176 A2 | 4/1989 |
| EP | 0 361 981 | 4/1990 |
| EP | 0 667 548 A1 | 8/1995 |
| EP | 0 788 005 | 8/1997 |
| EP | 1 139 159 | 10/2001 |
| EP | 1275997 | 1/2003 |
| EP | 1 435 336 | 7/2004 |
| EP | 1 473 691 A | 11/2004 |
| EP | 1473581 A2 | 11/2004 |
| EP | 1484635 | 12/2004 |
| FR | 2 824 643 A | 11/2002 |
| GB | 1 456 193 | 11/1976 |
| JP | 62 082454 | 4/1987 |
| JP | 05275401 A1 | 10/1993 |
| JP | 9-127439 | 5/1997 |
| JP | 11211999 | 8/1999 |
| JP | 11211999 A | 11/1999 |
| JP | 2000306515 A | 11/2000 |
| JP | 2001-221913 | 8/2001 |
| JP | 2002-062490 | 2/2002 |
| JP | 2002277771 A | 9/2002 |
| JP | 2003195201 | 7/2003 |
| JP | 2003195201 A | 7/2003 |
| JP | 2004157527 A | 6/2004 |
| JP | 2004235465 A | 8/2004 |
| JP | 2004286825 A | 10/2004 |
| JP | 2005 279831 | 10/2005 |
| TW | 157313 | 5/1991 |
| WO | WO 95/30924 | 11/1995 |
| WO | WO 97/17628 | 5/1997 |
| WO | WO 99/52006 A2 | 10/1999 |
| WO | WO 99/52006 A3 | 10/1999 |
| WO | WO 02/079853 | 10/2002 |
| WO | WO 03/007049 A1 | 1/2003 |
| WO | WO 03/014789 A2 | 2/2003 |
| WO | WO 03/054925 | 7/2003 |
| WO | WO 03/069404 | 8/2003 |
| WO | WO 03/069413 A1 | 8/2003 |
| WO | WO 03/073151 A1 | 9/2003 |
| WO | WO 03/085728 A1 | 10/2003 |
| WO | WO 2004/006003 A1 | 1/2004 |
| WO | WO 2004/026757 A2 | 4/2004 |
| WO | WO 2005/006364 A1 | 1/2005 |
| WO | WO 2006/007042 | 1/2006 |
| WO | WO 2006/014929 | 2/2006 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Aratani K., et al., "Surface micromachined tuneable interferometer array," Sensors and Actuators, pp. 17-23. (1994).

Bass, "Handbook of Optics, vol. 1, Fundamentals, Techniques, and Design, Second Edition," McGraw-Hill, Inc., New York, pp. 2.29-2.36 (1995).

Butler et al., "An Embedded Overlay Concept for Microsystems Packaging," IEEE Transactions on Advanced Packaging IEEE USA, vol. 23, No. 4, pp. 617-622, XP002379648 (2000).

Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.

Chunjun Wang et al., "Flexible curuit-based RF MEMS Switches," MEMS. XP002379649 pp. 757-762, (Nov. 2001).

Conner, "Hybrid Color Display Using Optical Interference Filter Array," SID Digest, pp. 577-580 (1993).

Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119-1121 (Sep. 1994).

Goossen, "MEMS-based variable optical interference devices," Optical MEMS, 2000 IEEE/LEDS Int'l. Conf. on Aug. 21-24, 2000, Piscatawny, NJ, Aug. 21, 2000, pp. 17-18.

Gosch, "West Germany Grabs the Lead in X-Ray Lithography," Electronics pp. 78-80 (Feb. 5, 1987).

Howard et al., "Nanometer-Scale Fabrication Techniques", VLSI Electronics: Microstructure Science, vol. 5, pp. 145-153 and pp. 166-173 (1982).

Ibbotson et al., "Comparison of XeF2 and F -atom reactions with Si and SiO2," Applied Physics Letters, vol. 44, No. 12, pp. 1129-1131 (Jun. 1984).

Jackson, "Classical Electrodynamics", John Wiley & Sons Inc., pp. 568-573. (date unknown).

Jerman et al., "A Miniature Fabry-Perot Interferometer with a Corrugated Silicon Diaphragm Support", (1988).

Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.

Joannopoulos et al., "Molding the Flow of Light," Photonic Crystals. 1995.

Johnson "Optical Scanners", Microwave Scanning Antennas, vol. 1, p. 251-261, (1964).

Circle 36: Light over Matter, Circle No. 36 (Jun. 1993).

Miles, Mark, W., "A New Reflective FPD Technology Using Interferometric Modulation", The Proceedings of the Society for Information Display (May 11-16, 1997).

Nagami et al., "Plastic Cell Architecture: Towards Reconfigurable Computing for General-Purpose," Proc. IEEE Workshop on FPGA-based Custom Computing Machines, (1998).

Newsbreaks, "Quantum-trench devices might operate at terahertz frequencies", Laser Focus World (May 1993).

Oliner et al., "Radiating Elements and Mutual Coupling", Microwave Scanning Antennas, vol. 2, pp. 131-141, (1966).

Peerlings et al., "Long Resonator Micromachined Tunable GaAs-A1As Fabry-Perot Filter," IEEE Photonics Technology Letters, IEEE Service Center, Piscatawny, NJ, vol. 9, No. 9, Sep. 1997, pp. 1235-1237.

Raley et al., "A Fabry-Perot Microinterferometer for Visible Wavelenghts", IEEE Solid-State Sensor and Actuator Workshop, Jun. 1992, Hilton Head, SC.

Schnakenberg, et al. TMAHW Etchants for Silicon Micromachining. 1991 International Conference on Solid State Sensors and Actuators-Digest of Technical Papers. pp. 815-818.

Sperger et al., "High Performance Patterned All-Dielectric Interference Colour Filter for Display Applications", SID Digest, pp. 81-83, (1994).

Stone, "Radiation and Optics, An Introduction to the Classical Theory", McGraw-Hill, pp. 340-343, (1963).

Walker, et al., "Electron-beam-tunable Interference Filter Spatial Light Modulator", Optics Letters vol. 13, No. 5, pp. 345-347, (May 1988).

Williams, et al. Etch Rates for Micromachining Processing. Journal of Microelectromechanical Systems, vol. 5, No. 4, pp. 256-259, (Dec. 1996).

Winters, et al. The etching of silicon with XeF2 vapor. Applied Physics Letters, vol. 34, No. 1, pp. 70-73, (Jan. 1979).

Winton, John M., "A novel way to capture solar energy", Chemical Week, (May 1985).

Wu, "Design of a Reflective Color LCD Using Optical Interference Reflectors", ASIA Display '95, pp. 929-931, (Oct. 1995).

Wu et al., "MEMS Designed for Tunable Capacitors," Microwave Symposium Digest, 1998 IEEE MTT-S Int'l., Baltimore, MD, Jun. 7-12, 1998, vol. 1, pp. 127-129.

Zhou et al., "Waveguide Panel Display Using Electromechanical Spatial Modulators," SID Digest, vol. XXIX, 1998.

International Search Report and Written Opinion of the International Searching Authority for PCT/US2005/005919 dated Aug. 24, 2005.

International Search Report Application No. PCT/US2005/026448, Dated Nov. 23, 2005.

International Search Report Application No. PCT/US2005/029820, Dated Dec. 27, 2005.

International Search Report Application No. PCT/US2005/030962, Dated Aug. 31, 2005.

International Search Report Application No. PCT/US2005/034465, Dated Sep. 23, 2005.

European Search Report Application No. 05255693.3-2217, dated May 24, 2006.

European Search Report Application No. EP 05 25 5673 in 9 pages, dated Jan. 23, 2006.

Austrian Search Report No. 162/2005, Dated Jul. 14, 2005.

Austrian Search Report No. 164/2005, Dated Jul. 4, 2005.

Austrian Search Report No. 140/2005, Dated Jul. 15, 2005.

Austrian Search Report No. 161/2005, Dated Jul. 15, 2005.

Austrian Search Report No. 150/2005, Dated Jul. 29, 2005.

Austrian Search Report No. 144/2005, Dated Aug. 11, 2005.

Austrian Search Report No. 66/2005, Dated May 9, 2005.

Fan et al., Channel Drop Filters in Photonic Crystals, Optics Express, vol. 3, No. 1, 1998.

Fork, et al., "P-67: Chip on Glass Bonding using StressedMetal™ Technology" Sid 05 Digest, May 24, 2005.

Kim et al., "Control of Optical Transmission Through metals Perforated With Subwave-Length Hole Arrays," Optic Letters, vol. 24, No. 4, Feb. 15, 1999, pp. 256-257.

Lin et al., "Free-Space Micromachined Optical Switches for Optical Networking," IEEE Journal of Selected Topics in Quantum Electronics, vol. 5, No. 1m Jan./Feb. 1999, pp. 4-9.

Little et al., "Vertically Coupled Microring Resonator Channel Dropping Filter," IEEE Photonics Technology Letters, vol. 11, No. 2, 1999.

Magel, "Integrated Optic Devices Using Micromachined Metal Membranes," SPIE vol. 2686, 0-8194-2060-3/1996.

Science and Technology, The Economist, May 22, 1999, pp. 89-90.

Invitation to Pay Additional Fees for PCT/US07/003647 filed Dec. 2, 2007.

ISR and WO for PCT/US07/003647 filed Feb. 12, 2007.

Feenstra et al., Electrowetting displays, Liquivista BV, 16 pp., Jan. 2006.

Taii et al., "A transparent sheet display by plastic MEMS," Journal of the SID 14(8):735-741, 2006.

IPRP for PCT/US07/003647 filed Feb. 12, 2007.

* cited by examiner

MEMS DEVICE HAVING A LAYER MOVABLE AT ASYMMETRIC RATES

BACKGROUND OF THE INVENTION

1. Field of the Invention

The field of the invention relates to microelectromechanical systems (MEMS).

2. Description of the Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

The system, method, and devices of the invention each have several aspects, no single one of which is solely responsible for its desirable attributes. Without limiting the scope of this invention, its more prominent features will now be discussed briefly. After considering this discussion, and particularly after reading the section entitled "Detailed Description of Certain Embodiments" one will understand how the features of this invention provide advantages over other display devices.

In certain embodiments, a microelectromechanical (MEMS) device comprises a substrate and a movable layer mechanically coupled to the substrate. The movable layer is movable between a first position and a second position. The movable layer moves from the first position to the second position at a first rate and from the second position to the first position at a second rate. The second rate is faster than the first rate. The MEMS device further comprises an adjustable cavity defined between the substrate and the movable layer. The adjustable cavity contains a fluid. The MEMS device further comprises a fluid conductive element through which the fluid flows at a first flowrate from inside the adjustable cavity to outside the adjustable cavity upon movement of the movable layer from the second position to the first position and through which the fluid flows at a second flowrate from outside the adjustable cavity to inside the adjustable cavity upon movement of the movable layer from the first position to the second position. The second flowrate is slower than the first flowrate In certain embodiments, a method of manufacturing a microelectromechanical (MEMS) device comprises providing a substrate, forming a sacrificial layer on the substrate, forming a movable layer on the sacrificial layer, and removing the sacrificial layer. The movable layer is movable between a first position and a second position. The movable layer moves from the first position to the second position at a first rate and from the second position to the first position at a second rate. The second rate is faster than the first rate. The method further comprises forming a fluid conductive element through which fluid flows at a first flowrate from a region between the substrate and the movable layer upon movement of the movable layer towards the substrate and through which fluid flows at a second flowrate into the region upon movement of the movable layer away from the substrate. The second flowrate is slower than the first flowrate.

In certain embodiments, a microelectromechanical (MEMS) device comprises means for supporting a MEMS device, means for reflecting light, means for moving the reflecting means between a first position and a second position, an adjustable cavity between the supporting means and the moving means, and means for conducting fluid from inside the adjustable cavity to outside the adjustable cavity and from outside the adjustable cavity to inside the adjustable cavity. The reflecting means moves from the first position to the second position at a first rate and from the second position to the first position at a second rate. The second rate is faster than the first rate. The fluid conducting means conducts fluid from inside the adjustable cavity to outside the adjustable cavity upon movement of the moving means from the second position to the first position at a first flowrate. The fluid conducting means conducts fluid from outside the adjustable cavity to inside the adjustable cavity upon movement of the moving means from the first position to the second position at a second flowrate. The second flowrate is slower than the first flowrate.

In certain embodiments, a microelectromechanical (MEMS) device comprises a substrate, a movable layer mechanically coupled to the substrate, and an adhesive layer on at least a portion of the substrate or the movable layer. The movable layer is movable between a first position and a second position. The movable layer moves from the first position to the second position at a first rate and from the second position to the first position at a second rate. The second rate is faster than the first rate. The adhesive layer increases adhesion between the movable layer and the substrate when the movable layer is in the position closer to the substrate.

In certain embodiments, a microelectromechanical (MEMS) device comprises a substrate and a movable layer mechanically coupled to the substrate. The movable layer is movable between a first position and a second position in response to a voltage applied between a first electrode and a second electrode. The first electrode is configured to communicate with a diode. The diode is configured to allow a charge to flow from the first electrode to a capacitor between the first electrode and the second electrode and a leakage resistor in parallel with the capacitor. The diode is further configured to block the charge from flowing from the capacitor to the first electrode. The movable layer moves from the first position to the second position at a first rate and from the second position to the first position at a second rate. The second rate is faster than the first rate.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

A deformable mechanical membrane (or layer) useful to form a display device is provided. The membrane moves from a first position to a second position faster than the membrane moves from the second position to the first position. This asymmetric rate of movement enables the interferometric modulator to be operated without using a hysteresis protocol, which is desirable in some devices. In some embodiments, fluid conductive elements which cause asymmetric rates of movement of the mechanical layer are formed in the mechanical layer or in a support structure between the mechanical layer and the substrate. In some embodiments, an adhesive layer which causes asymmetric rates of movement of the mechanical layer is formed between the mechanical layer and the substrate. In some embodiments, a diode and a leakage resistor are in communication with the mechanical layer and cause asymmetric rates of movement of the mechanical layer.

Figure 1:
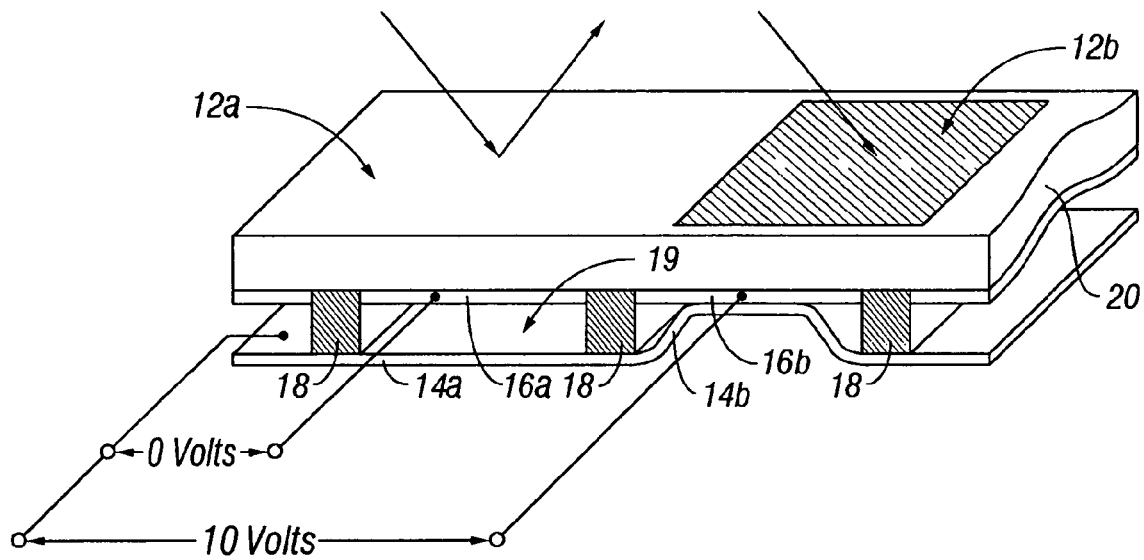
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
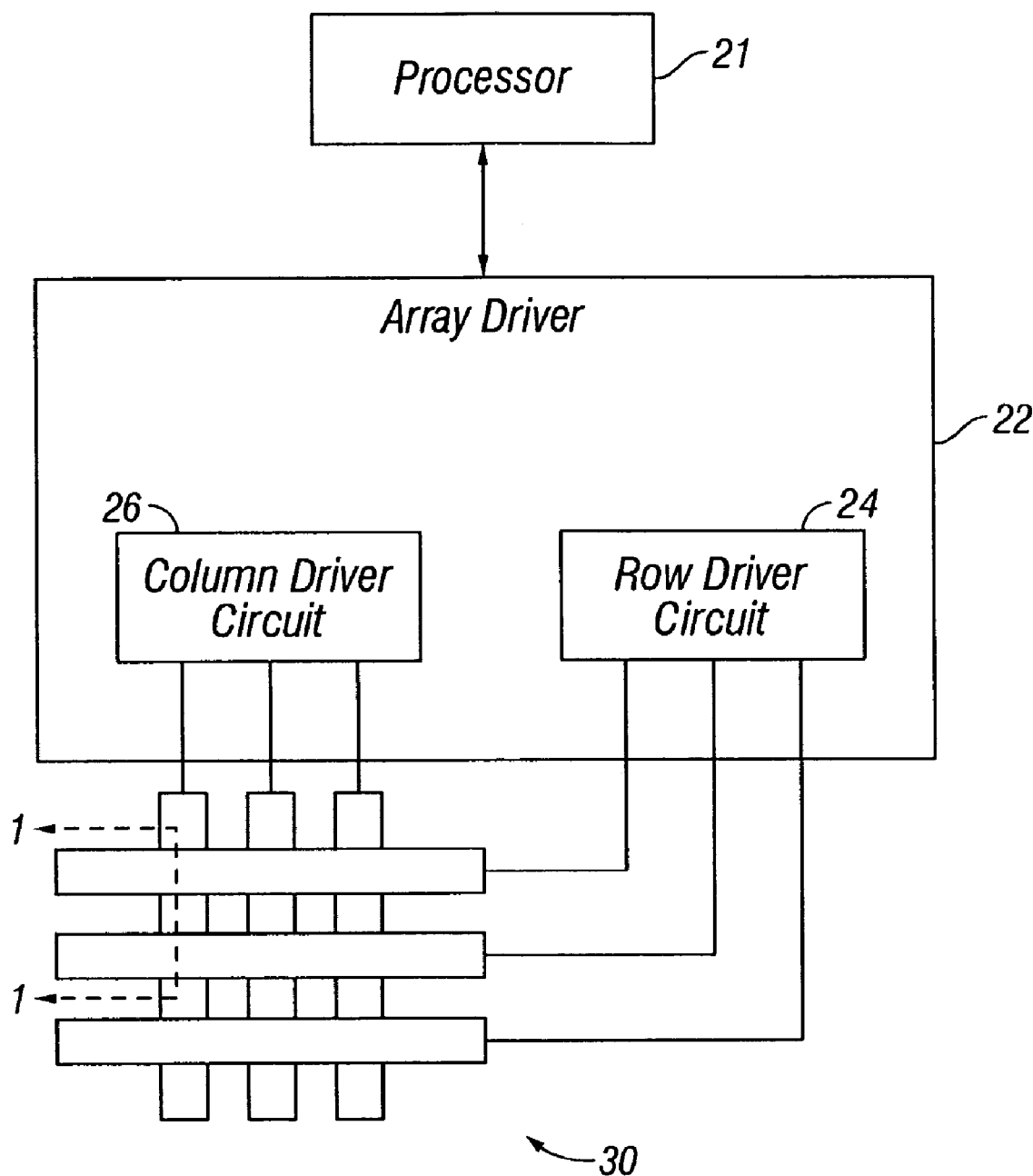
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
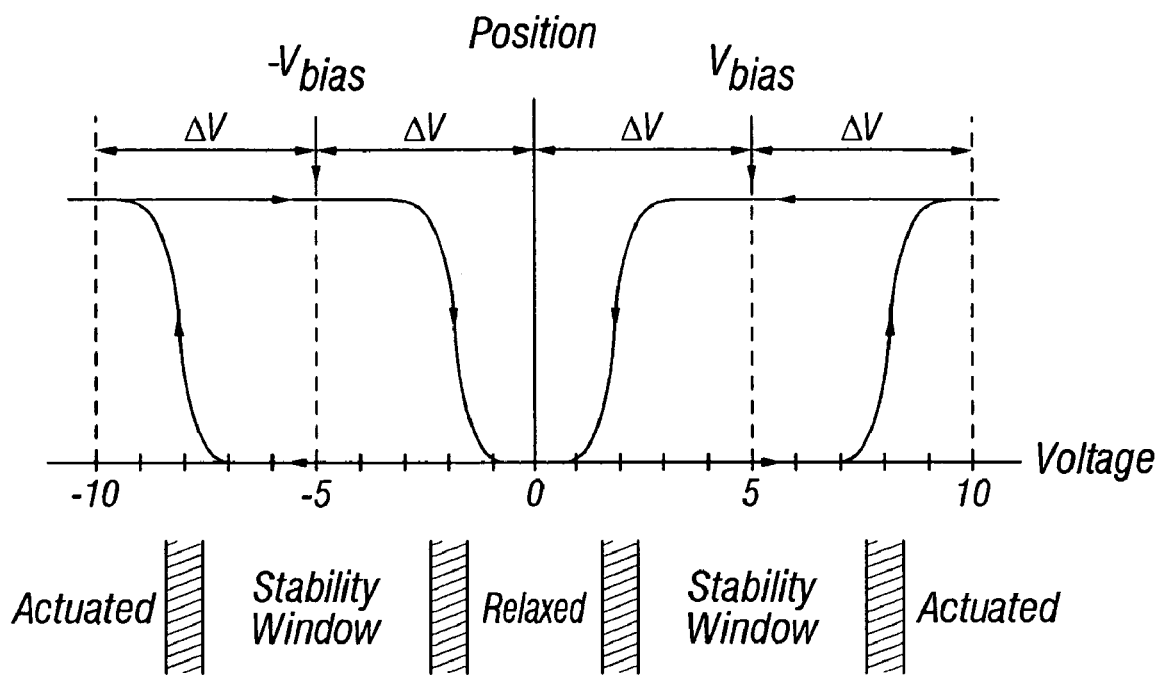
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
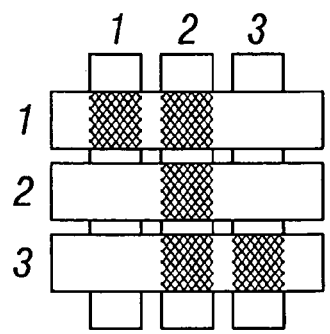
FIG. 5A illustrates one exemplary frame of display data in the 3×3 interferometric modulator display of FIG. 2.
Figure 5B:
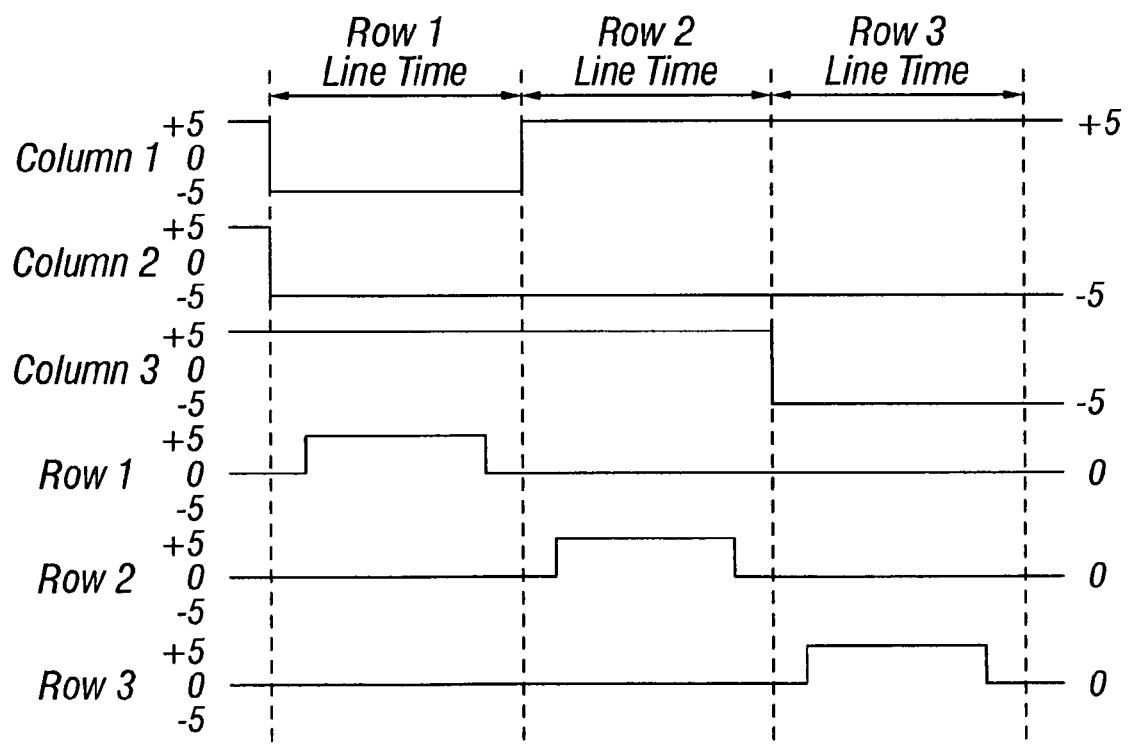
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively. Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
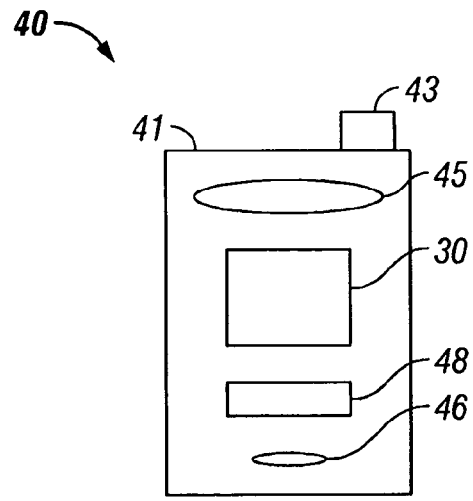
FIGS. 6A and 6B are system block diagrams illustrating an embodiment of a visual display device comprising a plurality of interferometric modulators.
Figure 6B:
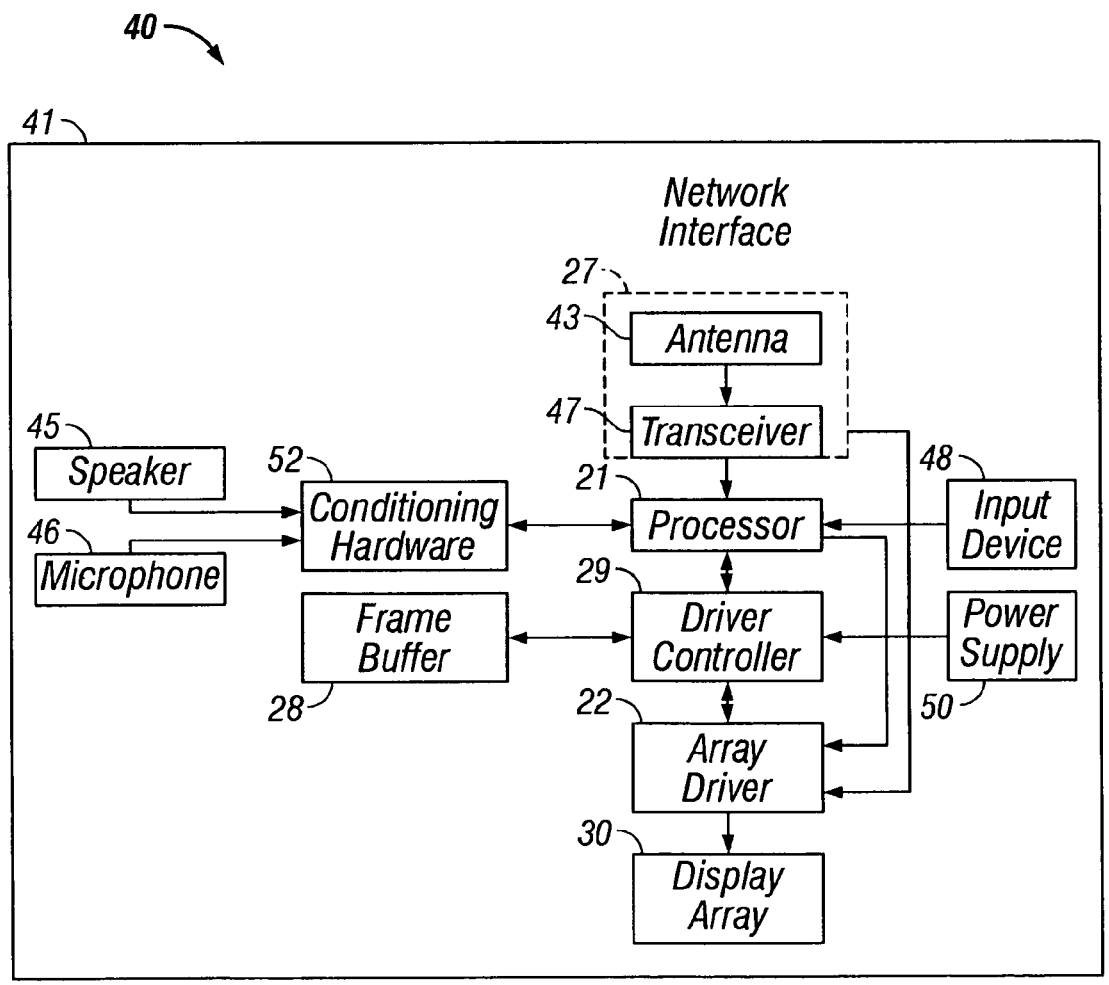

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including, but not limited to, plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
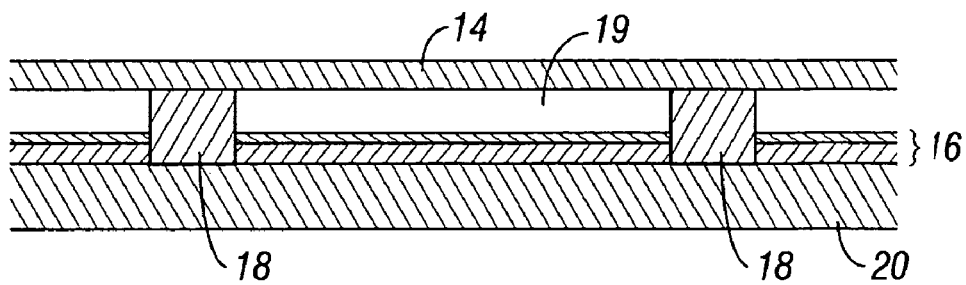
FIG. 7A is a cross section of the device of FIG. 1.
Figure 7B:
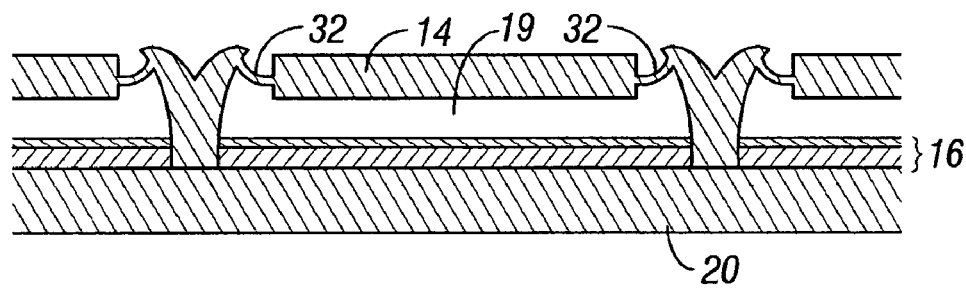
FIG. 7B is a cross section of an alternative embodiment of an interferometric modulator.
Figure 7C:
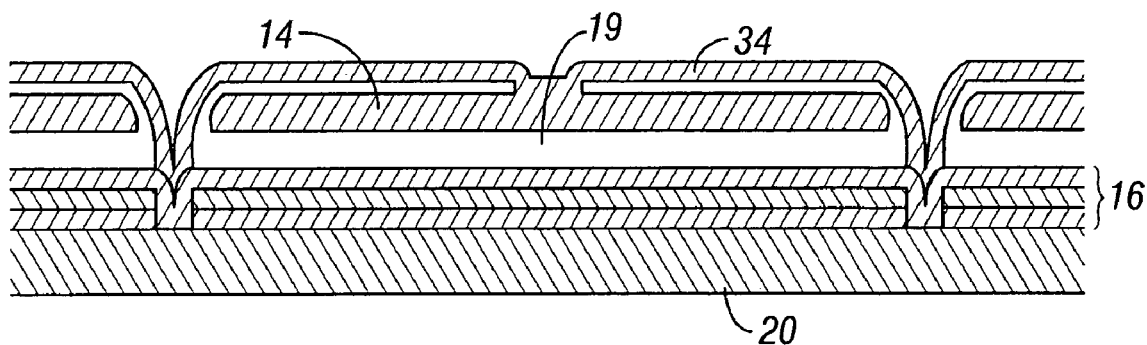
FIG. 7C is a cross section of another alternative embodiment of an interferometric modulator.
Figure 7D:
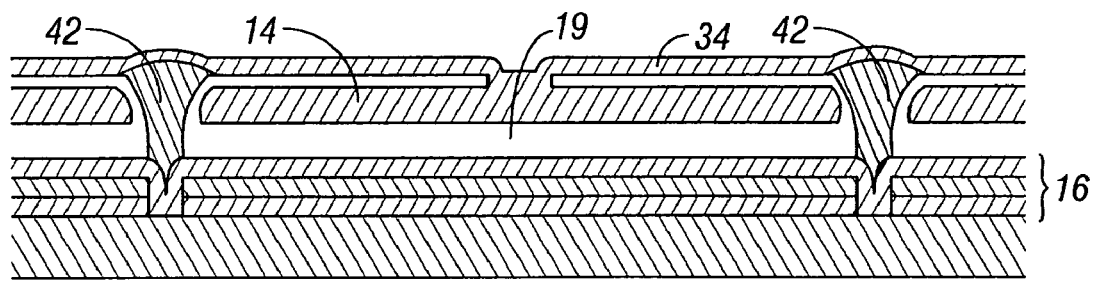
FIG. 7D is a cross section of yet another alternative embodiment of an interferometric modulator.
Figure 7E:
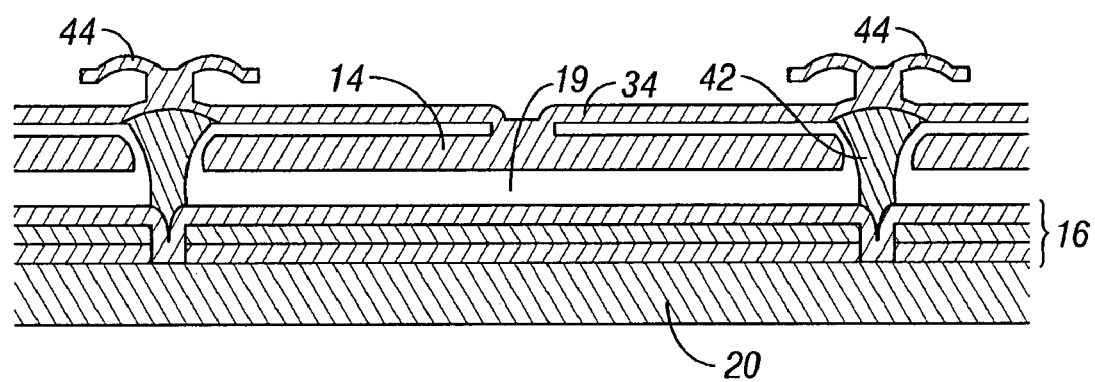
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the movable reflective layer 14 is attached to supports at the corners only, on tethers 32. In FIG. 7C, the movable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42: The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

In certain embodiments, it is desirable for the movable layer to transition from the relaxed state to the actuated/deformed state very quickly. It can be advantageous for the opposite transition back to the relaxed state to occur slowly, even when no voltage is present across the electrodes of a given pixel. In certain embodiments, it can be advantageous for the transition from the actuated state to the relaxed state to occur quickly and for the opposite transition from the relaxed state to the actuated state to occur slowly, which skilled artisans will recognize can be achieved by modifications of the embodiments described in detail herein. This asymmetry in the transition rate can be referred to as mechanical persistence, whereby the movable layer deforms quickly in response to a voltage pulse across the electrodes, but remains in the deformed state for a while after the pulse is over. In some display embodiments, this mechanical persistence results in the formed image persisting for the time necessary to sequentially actuate all the rows of the display, at which point a "refresh" can be performed before the image decays due to relaxation of the individual modulators. In addition, if a set of movable layers in a display are not fully relaxed between image refresh cycles, a refresh or update can be performed faster and with less energy since the voltages can be smaller, as described in more detail below. Asymmetric rates can result in other advantages as well. For example, asymmetric rates can mitigate stiction or adhesion between the movable layer and the substrate in the actuated state. In certain embodiments in which the movable layer is actuated at a slower rate, a smaller contact area between the movable layer and the substrate can result because the impact of the movable layer on the substrate is smaller. In other embodiments having slow relaxation rates, stiction or adhesion is at least partially alleviated since the contact area between the movable layer and the substrate is allowed to reduce during the slow relaxation process (e.g., for viscous materials or for meniscuses formed at the contact interface). In certain other embodiments, breaking the contact slowly advantageously allows breaking of contact points forming the physical contact between the surfaces, or "asperity contacts," one after the other rather than breaking all of the asperity contacts simultaneously as occurs in high relaxation rates.

Stable operation of the MEMS interferometric modulator is achieved by selecting mechanical design features of the interferometric modulator that optimize the actuation and release times for the particular row/column actuation protocol. Described herein are certain structures and methods of making interferometric modulators having varying release and actuation times. In general, the mechanical persistence of the movable layer may be changed by manipulating forces acting upon the movable layer, such as a differential fluid pressure (e.g., a differential gas pressure, a differential liquid pressure, or a combination of liquid and gas pressures), and adhesion. Typically, the pressure acting upon the movable layer will be from a gas (e.g., air) occupying a space above and/or below the movable layer. In other embodiments, the gas may be any gas suitable for use in an interferometric modulator. In other embodiments, a low-viscosity liquid occupying the space above and/or below the movable layer exerts a pressure on the movable layer. In some embodiments, the fluid comprises a liquid dissolved in a gas that condenses in the cavity 19 when the movable layer 14 actuates, as described later herein. A differential pressure that acts in a direction towards the actuated position will decrease actuation time and increase release time. Conversely, a differential pressure that acts in a direction towards the relaxed position will increase actuation time and decrease release time.

The following description and accompanying figures include examples of methods and structures for manipulating the mechanical persistence of the movable layer of an interferometric modulator. Although many of the protocols, methods, and apparatuses described herein reference gas pressures, these same protocols, methods, and apparatuses may be used with other fluid pressures.

As used herein, the term "cavity" is to be given its broadest ordinary meaning, including, but not limited to, a space or hollow area that is bounded at least in part by a material such as, but not limited to, one or more layers or structures. As used herein, the terms "hole," "aperture," and "perforation" are to be given their broadest ordinary meanings including, but not limited to, an opening, open space, or an area that does not contain a solid material. As used herein, the term "substrate" is to be given its broadest ordinary meaning, including, but not limited to, a layer fabricated out of any material, including, but not limited to, glass and plastic. The substrate may also have a variety of forms, including, but not limited to, a homogeneous substance or a non-homogenous substance, or having a uniform thickness or a non-uniform thickness. The substrate may also have several sublayers, a shorter expanse or region, or multiple expanses or regions. The substrate may comprise an optical stack, as described above.

Figure 8A:
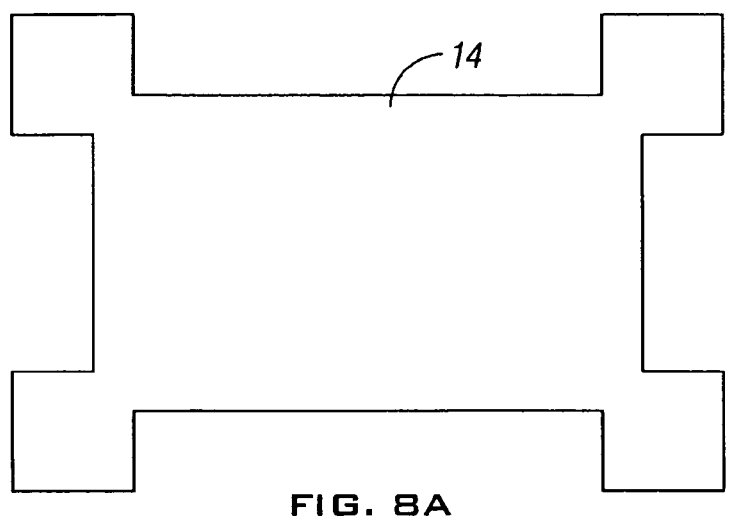
FIGS. 8A, 8B, and 8C illustrate geometric variations in the movable reflective layer that affect the actuation and release times of the modulator so as to improve the operational response of the modulator.
Figure 8B:
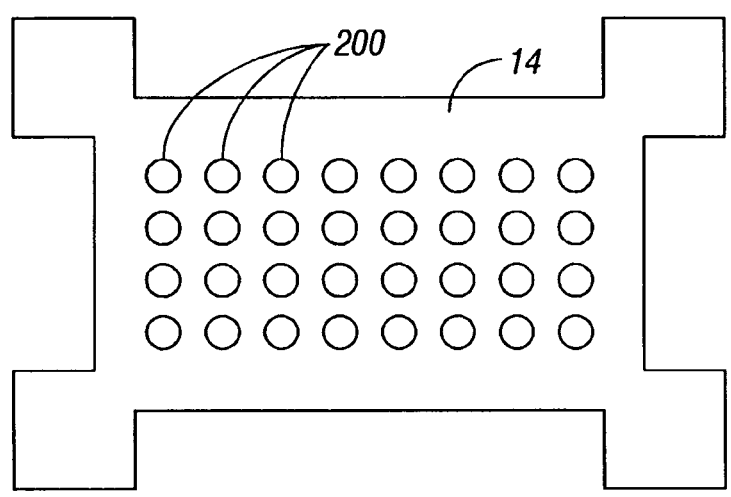
Figure 8C:
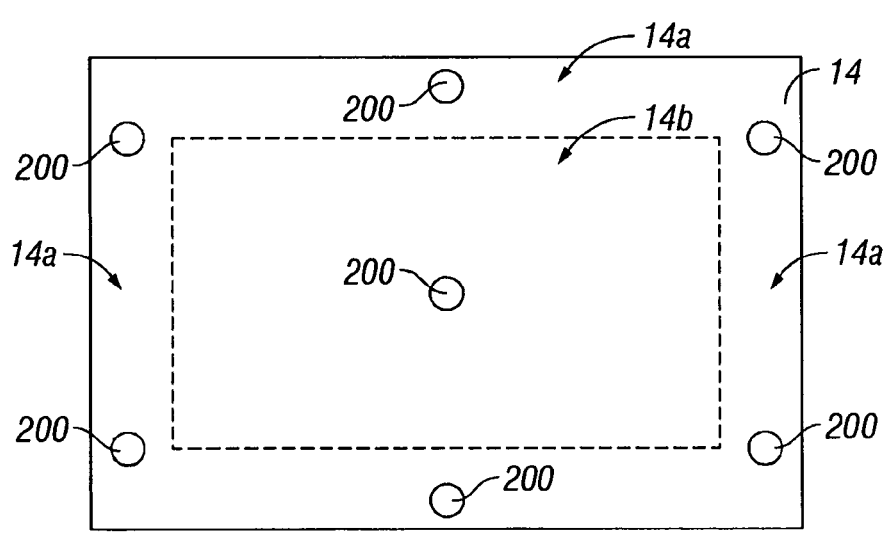

FIGS. 8A through 8C illustrate a geometric variation in the movable layer 14 that affects a fluid pressure (e.g., a gas pressure) acting upon the movable layer 14, thereby affecting actuation and release times of the modulator so as to improve the operational response of the modulator. When the modulator is actuated and the cavity 19 (depicted in FIG. 1 and FIGS. 7A through 7E) is collapsed, fluid in the cavity 19, typically air, is forced out of the cavity 19. By perforating the movable layer 14, the fluid is allowed to pass out of the cavity 19 through the movable layer 14, resulting in a decrease in the actuation time. FIG. 8A illustrates an embodiment of a solid movable layer 14 around which the fluid flows from out of the cavity 19 when the movable layer 14 moves from the relaxed state to the actuated state. FIG. 8B illustrates an example of a movable layer 14 that includes one or more apertures 200 (also referred to as holes or perforations). The apertures 200 provide additional pathways for fluid to flow from out of the cavity 19 when the movable layer 14 moves from the relaxed state to the actuated state. Thus, the apertures 200 can decrease the actuation time of the modulator. The apertures 200 also decrease the release time of the modulator, however, by providing additional pathways for fluid (e.g., gas) to flow into the cavity 19 when the movable layer 14 moves from the actuated state to the relaxed state.

As illustrated in FIG. 8C, the apertures 200 may be located anywhere on the movable layer 14, including an edge portion 14a on a periphery of the movable layer 14 and an inside portion 14b of the movable layer 14. Moreover, the apertures 200 may be of any size or pattern, including, but not limited to, rectangular and/or circular shapes that are scattered and/or in an ordered array.

Figure 9:
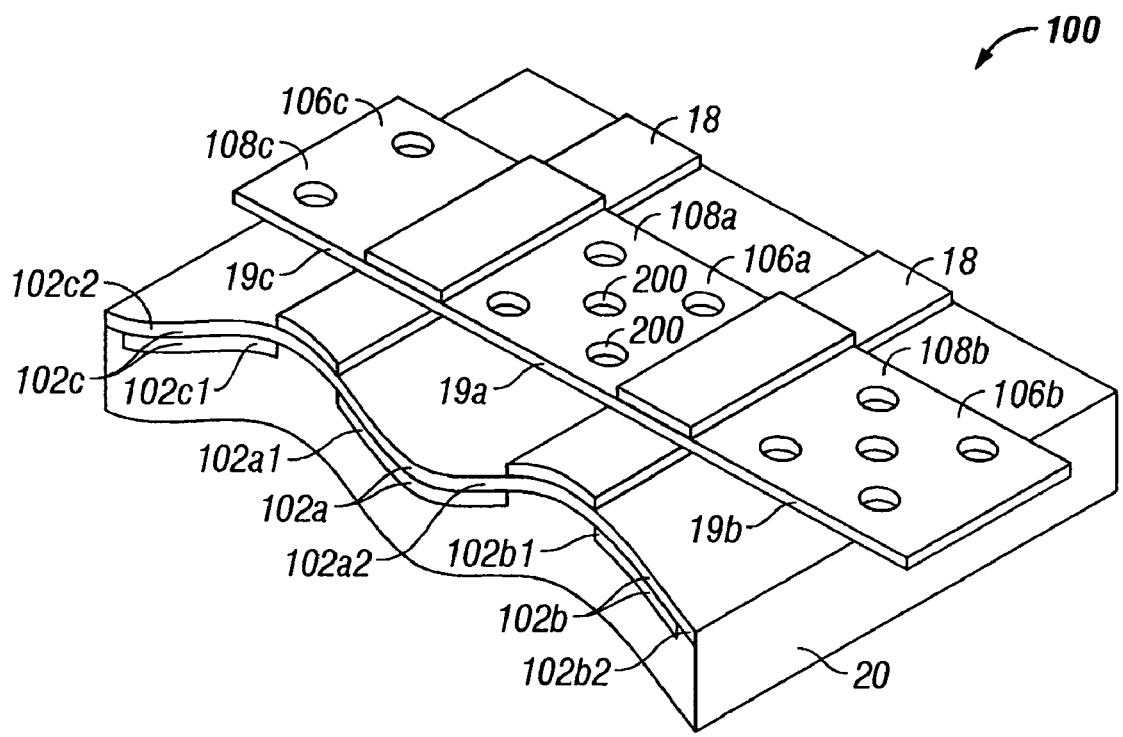
FIG. 9 is a partial perspective view of a modulator that includes holes in the movable layer.

FIG. 9 illustrates an example of an interferometric modulator 100 for which the actuation time of the modulator is decreased as compared to the modulator illustrated in FIGS. 1 and 7A-7E. Referring to FIG. 9, the interferometric modulator 100 includes an array of cavities 19a, 19b, 19c fabricated on a substrate 20. As described below, the cavities 19a, 19b, 19c are filled with a fluid, such as air.

Each cavity 19a, 19b, 19c may be formed by a combination of dielectric and metallic materials forming mirrors on two layers. The first layer 102a, 102b, 102c forming the cavities 19a, 19b, 19c, respectively, is a primary mirror/conductor comprised of a transparent conductive coating upon which a dielectric or metallic mirror has been fabricated. In some embodiments, first layers 102a, 102b, 102c may include a lower layer 102a1, 102b1, 102c1, respectively, comprised of indium-tin-oxide (also referred to herein as ITO). In some embodiments, the first layers 102a, 102b, 102c may also include an upper layer 102a2, 102b2, 102c2, respectively, comprised of chromium. The ITO functions as an optically transparent electrical conductor, and the chromium functions as a partial reflector. In certain embodiments, the first layers 102a, 102b, 102c comprise an optical stack 16 formed on the substrate 20.

Supports 18 space the second layer 106a, 106b, 106c of the cavities 19a, 19b, 19c, respectively, from the corresponding first layers 102a, 102b, 102c. The second layer 106a, 106b, 106c of certain embodiments comprise a movable layer 14 and functions as the secondary mirror/conductor. The second layer 106a, 106b, 106c may comprise aluminum and is flexible. The second layer 106a, 106b, 106c is also fabricated such that it is under tensile stress and thus is parallel to and spaced apart from the substrate 20 in the relaxed state.

As shown in FIG. 9, the second layers 106a, 106b, and 106c can include apertures 200 in the deforming regions 108a, 108b, 108c, respectively. These apertures 200 reduce a gas pressure acting upon the second layers 106a, 106b, 106c as each second layer 106a, 106b, 106c deforms downward through an intervening layer of gas that occupies the respective cavities 19a, 19b, 19c below the second layers 106a, 106b, 106c. Without the apertures 200, the gas occupying cavities 19a, 19b, 19c would exert a pressure on its respective second layer 106a, 106b, 106c as the second layer 106a, 106b, 106c deforms downward. With the apertures 200, however, the gas occupying cavities 19a, 19b, 19c is allowed to escape through the apertures 200 of the respective second layer 106a, 106b, 106c that is deforming towards the substrate 20, resulting in a decrease of the actuation time. Similarly, the apertures 200 allow gas to flow back into the cavities 19a, 19b, 19c when the respective second layers 106a, 106b, 106c return to the relaxed state.

Figure 10A:
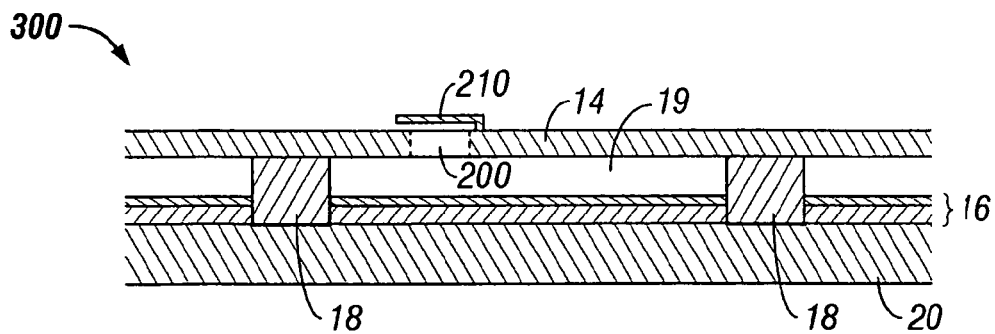
FIG. 10A illustrates an embodiment of a MEMS device having a layer movable at asymmetric rates.

FIG. 10A shows an example of a microelectromechanical (MEMS) device 300 in accordance with certain embodiments disclosed herein. The MEMS device 300 comprises a substrate 20 and a movable layer 14 mechanically coupled to the substrate 20. In certain embodiments, the movable layer 14 is directly mechanically coupled to the substrate 20 (e.g., as shown in FIG. 10A), while in other embodiments, the movable layer 14 is mechanically coupled to the substrate 20 by intervening structures (e.g., the support structure 18 shown in FIG. 13A). In still other embodiments, the optical stack 16 is integral with a first substrate and the movable layer 14 is integral with a second substrate that is mechanically coupled to the first substrate during the fabrication process. The movable layer 14 is movable between a first position and a second position. In certain embodiments, the second position is further from the substrate 20 than is the first position. For example, the first position can correspond to the position of the movable layer 14 when the device 300 is in an actuated state and the second position can correspond to the position of the movable layer 14 when the device 300 is in a relaxed or an unactuated state. In other embodiments, the second position is closer to the substrate 20 than is the first position. For example, the first position can correspond to the position of the movable layer 14 when the device 300 is in a relaxed or an unactuated state and the second position can correspond to the position of the movable layer 14 when the device 300 is in an actuated state. The movable layer 14 moves from the first position to the second position at a first rate and from the second position to the first position at a second rate. The second rate is faster than the first rate.

The substrate 20 may comprise a material that is at least partially transparent or translucent and at least partially reflective, such as glass and plastic. The substrate 20 may also be fabricated into a variety of forms, including, but not limited to, a homogeneous substance or a non-homogenous substance, or having a uniform thickness or a non-uniform thickness. The substrate 20 may also have several sublayers, a shorter expanse or region, or multiple expanses or regions. In certain embodiments, the substrate 20 includes an optical stack 16.

Figure 10B:
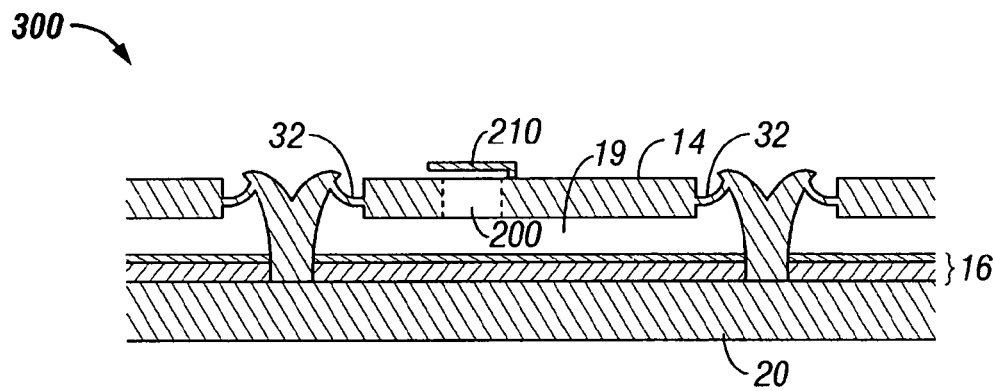
FIG. 10B illustrates an alternative embodiment of a MEMS device having a layer movable at asymmetric rates.
Figure 10C:
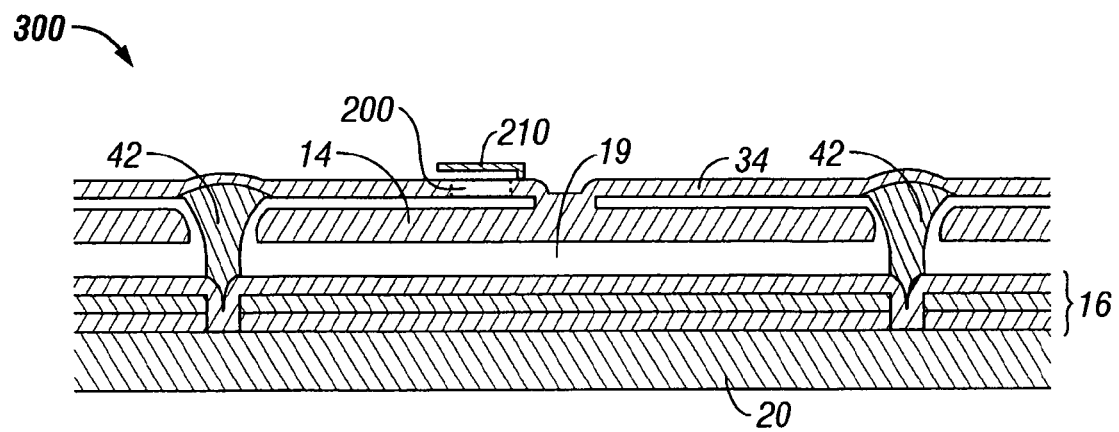
FIG. 10C illustrates another alternative embodiment of a MEMS device having a layer movable at asymmetric rates.

The movable layer 14 may comprise a material that is highly conductive and reflective, such as aluminum. The movable layer 14 may also be fabricated into a variety of forms, including, but not limited to, a homogeneous substance or a non-homogenous substance, or having a uniform thickness or a non-uniform thickness. The movable layer 14 may also have several sublayers, a shorter expanse or region, or multiple expanses or regions. In certain embodiments, the movable layer 14 comprises a substantially reflective surface facing the substrate 20. In certain embodiments, the movable layer 14 is deformable (e.g., as shown in FIG. 10A), while in other embodiments the movable layer 14 is mechanically coupled to deformable tethers 32 (e.g., as shown in FIG. 10B) or to deformable layers 34 (e.g., as shown in FIG. 10C).

The substrate 20 and the movable layer 14 may define an adjustable cavity 19 therebetween. The cavity 19 may be filled with gas, such as air, and/or liquid, such as liquids typically used in LCD displays or any other liquid suitable for use in displays. In certain embodiments, the cavity is filled with humid air.

As shown in FIG. 10A, the movable layer 14 may comprise at least one aperture 200 through the movable layer 14. Flow of fluid through the aperture 200 may be at least partially restricted or limited by a stopple 210 mechanically coupled to the movable layer 14. The stopple 210 may be stationary, deformable due to fluid pressure, or actuated by external means such as electrostatic, magnetic, thermoelectric, and shape memory alloys. In certain embodiments, the actuation and relaxation rates of the movable layer 14 can be controlled by modifying the geometry (e.g., length, width, thickness, etc.), materials, mechanical properties (e.g., elastic modulus), etc. of the stopple 14. In general, the stopple 210 may comprise any material (e.g., element, alloy, or other combination of elements) that is conductive, semi-conductive, insulating, reflective (e.g., aluminum), organic, or inorganic. In certain embodiments, the stopple 210 comprises the same material as the movable layer 14. As used herein, the term "stopple" is to be given its broadest ordinary meaning, including, but not limited to, a structure that at least partially obstructs a hole, a perforation, or an aperture. The stopple 210 can be a plug, a flap, or any other structure that occludes at least a portion of the aperture 200. In certain embodiments, a fluid conductive element comprises the stopple 210 and the aperture 200.

Figure 11A:
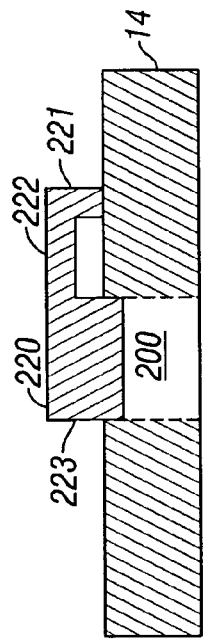
FIG. 11A illustrates a MEMS device having a layer movable at asymmetric rates from a second position to a first position including an aperture and a flap partially mechanically coupled to the movable layer in one position.
Figure 11B:
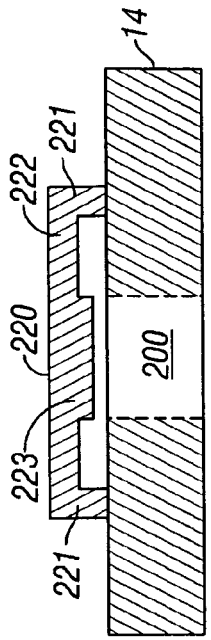
FIG. 11B illustrates a MEMS device having a layer movable at asymmetric rates from a second position to a first position including an aperture and a flap partially mechanically coupled to the movable layer in two positions.

In certain embodiments, the stopple 210 comprises a flap 210 at least partially covering the aperture 200 as schematically illustrated by FIG. 11A. The stopple 210 may be formed on either surface of the movable layer 14 depending on whether it is desirable for actuation to occur at a faster rate than relaxation or vice versa. The flap 210 comprises a flexible, substantially flat piece of material having a first portion 211 that is mechanically coupled to the movable layer 14 and a second portion 212 that is movable with respect to the movable layer 14. A flap 210 at least partially covering an aperture 200 may be referred to as an "actuated valve." As schematically illustrated in FIG. 11A, the first portion 211 of the flap 210 is bonded to the movable layer 14 in certain embodiments (e.g., by depositing the first portion 211 on the movable layer 14). The second portion 212 of the flap 210 is not mechanically coupled to the movable layer 14. For example, as schematically illustrated by FIGS. 11A and 11B, the second portion 212 of the flap 210 is spaced from the movable layer 14. As schematically illustrated in FIG. 11A, in certain embodiments, the first portion 211 of the flap 210 is mechanically coupled to the movable layer 14, and the second portion 212 of the flap 210 extends over the aperture 200. The end of the second portion 212 shown in FIG. 11A is free to move relative to the movable layer 14. As schematically illustrated in FIG. 11B, in certain embodiments, the flap 210 has two or more first portions 211 that are mechanically coupled to the movable layer 14, and the second portion 212 extends over the aperture 200 between the two first portions 211. While the ends of the second portion 212 are fixed, the second portion 212 between the first portions 211 is free to move relative to the movable layer 14.

In certain embodiments, instead of being flexible, the first portion 211 is coupled to the second portion 212 of the flap 210 by a hinge that provides the second portion 212 with a rotational degree of freedom around the axis of the hinge. In some embodiments, the rotational axis of the hinge is perpendicular to the movable layer 14, which allows the second portion 212 to move laterally from a position above the aperture 200 to a position not above the aperture 200. In some embodiments, the rotational axis of the hinge is parallel to the movable layer 14, which allows the second portion 212 to move similarly to the second portion 212 illustrated in FIG. 11A. Other structures for coupling the second portion 212 to the first portion 211 are also compatible with embodiments described herein.

Figure 11C:
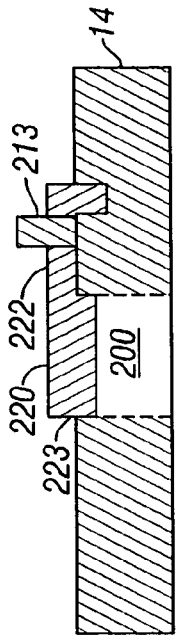
FIG. 11C illustrates a MEMS device having a layer movable at asymmetric rates from a second position to a first position including an aperture and a flap partially mechanically coupled to the movable layer by a brace.
Figure 11D:
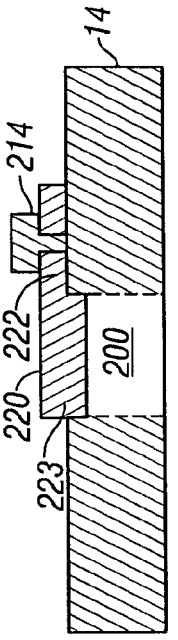
FIG. 11D illustrates a MEMS device having a layer movable at asymmetric rates from a second position to a first position including an aperture and a flap partially mechanically coupled to the movable layer by a rivet.

In certain other embodiments, the first portion 211 of the flap 210 is mechanically coupled to the mechanical layer 14 by a brace 213 that is attached to the movable layer 14 and that extends over at least a portion of the flap 210, as schematically illustrated by FIG. 11C. In certain other embodiments, the first portion 211 of the flap 210 is mechanically coupled to the movable layer 14 by a rivet 214 that is attached to the movable layer 14 and that extends through at least a portion of the flap 210, as schematically illustrated by FIG. 11D. Other structures to couple the first portion 211 of the flap 210 to the movable layer 14 and to not couple the second portion 212 of the flap 210 to the movable layer 14 are also compatible with embodiments described herein.

Figure 11E:
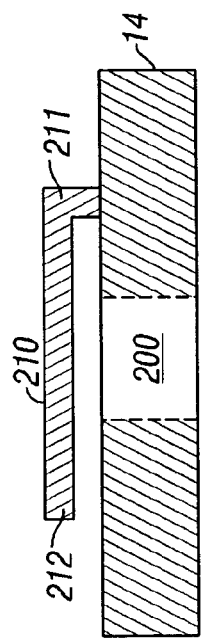
FIG. 11E illustrates a MEMS device having a layer movable at asymmetric rates from a second position to a first position including an aperture and a plug partially mechanically coupled to the movable layer in one position.
Figure 11F:
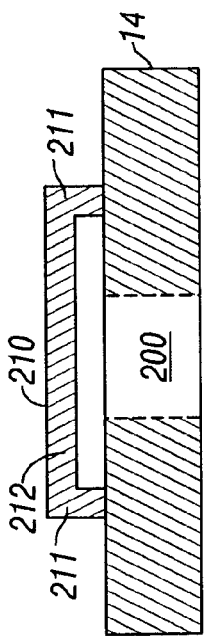
FIG. 11F illustrates a MEMS device having a layer movable at asymmetric rates from a second position to a first position including an aperture and a plug partially mechanically coupled to the movable layer in two positions.
Figure 11G:
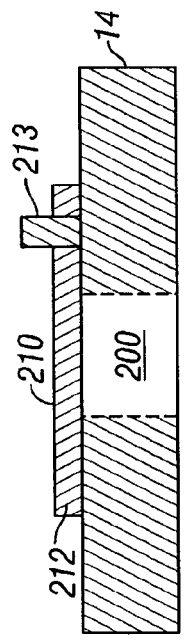
FIG. 11G illustrates a MEMS device having a layer movable at asymmetric rates from a second position to a first position including an aperture and a plug partially mechanically coupled to the movable layer by a brace.
Figure 11H:
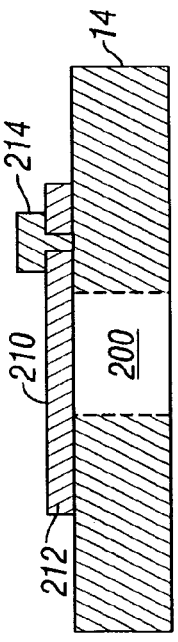
FIG. 11H illustrates a MEMS device having a layer movable at asymmetric rates from a second position to a first position including an aperture and a plug partially mechanically coupled to the movable layer by a rivet.

In certain embodiments, the stopple 210 comprises a plug 220 at least partially covering and filling the aperture 200, as schematically illustrated by FIG. 11E. A plug 220 at least partially covering an aperture 200 may also be referred to as an "actuated valve." The plug 220 comprises a first portion 221 mechanically coupled to the movable layer 14, a flexible second portion 222 and a third portion 223 that is sized and shaped to fit into the aperture 200. FIGS. 11E through 11H show embodiments in which a first portion 221 of the plug 220 is mechanically coupled to the movable layer 14 and the second portion 222 and the third portion 223 are movable with respect to the movable layer 14. In certain embodiments, the first portion 221 is mechanically coupled to the movable layer 14 by bonding or by a structure (e.g., a brace 213 or a rivet 214 as schematically illustrated in FIGS. 11G and 11H, respectively). As schematically illustrated in FIG. 11E, the plug 220 comprises one first portion 221 in certain embodiments. As schematically illustrated in FIG. 11F, the plug 220 comprises two or more first portions 221 in certain embodiments. In certain embodiments, the third portion 223 of the plug 220 is at least partially within the aperture 200 when the plug 220 is in a relaxed state (e.g., as shown in FIGS. 11E, 11G, and 11H). In certain other embodiments, the third portion 223 of the plug 220 is out of the aperture 200 when the plug 220 is in the relaxed state (e.g., as shown in FIG. 11F). The third portion 223 can be any shape that at least partially occludes the aperture 200, for example rectangular (as depicted in FIGS. 11E-11H), triangular, trapezoidal, or hemispherical.

In certain embodiments, the aperture 200 is formed by patterning and etching through the movable layer 14. In some embodiments, after the aperture 200 is formed, a sacrificial material is deposited over the aperture 200 and at least partially filling the aperture 200 in order to allow conformal deposition of the stopple 210 material over the aperture 200. In some embodiments, a first sacrificial material is used to at least partially fill the aperture 200 and a second sacrificial layer is deposited and patterned on the movable layer 14 in order to provide a gap between the movable layer 14 and the second portion 212, 222 of stopple 210 and to permit the first portion 211, 221 of the stopple 210 to bond to the movable layer 14 (e.g., by depositing the first portion 211, 221 on the movable layer 14). In some embodiments, the second sacrificial layer comprises the same material as the first sacrificial material in the aperture 200. The stopple 210 material is deposited over the movable layer 14 and the sacrificial material within the aperture 200. In embodiments where the stopple 210 comprises a plug 220, the stopple 210 material fills the remaining portion of the aperture 200 that is not filled by the sacrificial material. The stopple 210 material is then patterned to form the stopple 210, and the underlying sacrificial material is removed, for example by etching, to allow the stopple 210 to move relative to the movable layer 14. In certain embodiments comprising a structure (e.g., a brace or a rivet) to affix at least a portion of the stopple 210 to the movable layer 14, persons skilled in the art can provide appropriate patterning processing steps, such as photolithography and etching, in accordance with the embodiments described herein.

In certain embodiments, the stopple 210 is mechanically coupled to the movable layer 14 so that the stopple 210 is movable to vary the restriction of the aperture 200 depending on the direction of movement of the movable layer 14. Depending on the structure, the actuated valve can move up and down or sideways to at least partially engage and/or clear the aperture 200. The mechanical coupling of the stopple 210 to the movable layer 14 may be made at one location in proximity to the aperture 200 or at multiple locations, for example along an edge of the stopple 210. In certain embodiments, at least part of the stopple 210 is held in place, even during movement of the movable layer 14, while allowing at least another portion of the stopple 210 to move relative to the aperture 200 during movement of the movable layer 14. FIGS. 10B and 10C show alternative embodiments having apertures 200 and stopples 210 on a movable layer 14 and on a deformable layer 34, respectively, which similarly allow fluid flow into and out of the cavities 19. Other embodiments are possible as well, for example devices comprising apertures 200 and stopples 210 on the deformable layer 34 depicted in FIGS. 7C and 7E.

Figure 12A:
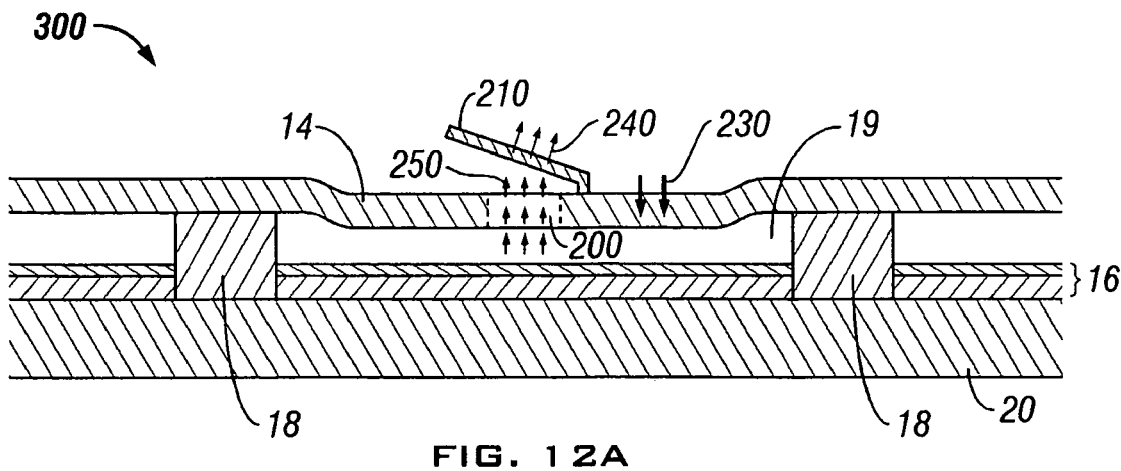
FIG. 12A illustrates a MEMS device having a layer movable at asymmetric rates moving from a second position to a first position.
Figure 12B:
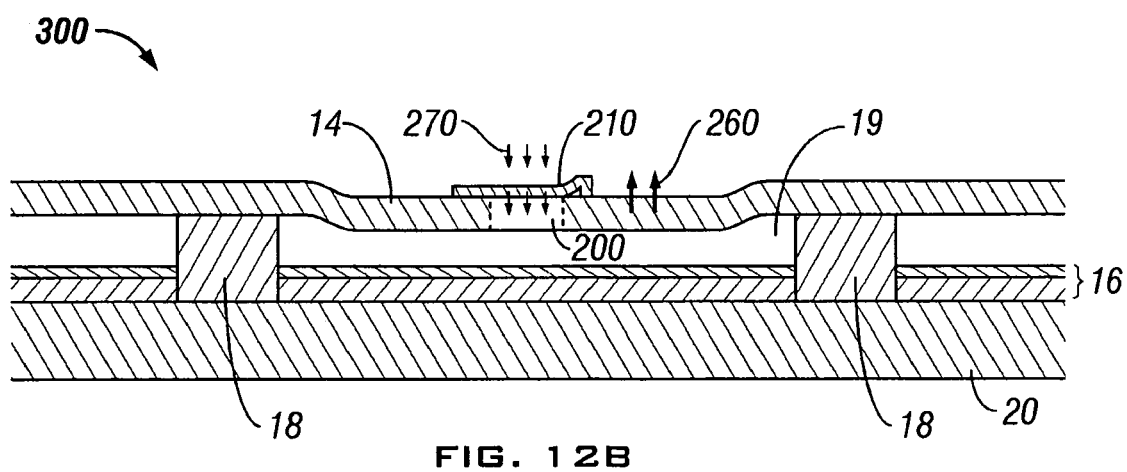
FIG. 12B illustrates a MEMS device having a layer movable at asymmetric rates moving from a first position to a second position.

FIGS. 12A and 12B schematically show the combination of the stopple 210 and the aperture 200 of FIG. 11A that creates a valve which allows fluid to flow easily in one direction but not easily in the opposite direction. While FIGS. 12A and 12B show the stopple 210 of FIG. 11A, other stopples 210, for example, those shown in FIGS. 11B-11H, perform in a similar manner. At least a portion of the stopple 210 moves away from the aperture 200 when the movable layer 14 moves between the relaxed state to the actuated state, as shown in FIG. 12A. When the movable layer 14 moves from the relaxed state to the actuated state (shown by arrows 230), fluid within the cavity 19 is compressed and applies a corresponding force on the stopple 210 in a direction opposite to the movement of the movable layer 14 (shown by arrows 240). This force moves at least a portion of the stopple 210 away from the aperture 200 so that the stopple 210 allows fluid to flow out of the cavity 19 through the aperture 200 (shown by arrows 250). As the movable layer 14 actuates downward, fluid from within the cavity 19 flows out of the cavity 19 through the available pathways, including through the aperture 200, relatively unimpeded, so the movable layer 14 is not appreciably slowed by the fluid pressure within the cavity 19 when moving from the relaxed state to the actuated state.

Conversely, as shown in FIG. 12B, when the movable layer 14 moves from the actuated state to the relaxed state (shown by arrows 260), fluid outside the cavity 19 applies a force on the stopple 210 towards the aperture 200 (shown by arrows 270), thereby at least partially covering the aperture 200 and inhibiting fluid from flowing into the cavity 19 through the aperture 200. As the movable layer 14 moves upward, the fluid has fewer pathways to flow into the cavity 19 than it did during actuation, so the fluid forces directed against the movement of the movable layer 14 are greater, thereby appreciably slowing the movable layer 14 as it moves from the actuated state to the relaxed state. In certain embodiments, the stopple 210 is configured on the opposite side of the aperture 200 so the movement of the stopple 210 is in the opposite direction, such that the fluid flow into the cavity 19 during movement of the movable layer 14 from the actuated state to the relaxed state is faster than the fluid flow out of the cavity 19 during movement of the movable layer 14 from the relaxed state to the actuated state.

In some embodiments, the movable layer 14 comprises at least one valve including an aperture 200 and a stopple 210, wherein fluid flows through the valve at a first flowrate when the movable layer 14 moves from the relaxed state to the actuated state and wherein fluid flows at a second flowrate when the movable layer 14 moves from the actuated state to the relaxed state. As described above, the movement of the stopple 210 in response to fluid forces acting upon the stopple 210 during the movement of the movable layer 14 can result in the first flowrate being faster than the second flowrate. In certain embodiments, the difference in flowrates of fluid flowing through the aperture 200 during actuation and relaxation will cause the movement of the movable layer 14 to be about 100 times faster during actuation than during relaxation. In other embodiments, the difference in flowrate causes the movement of the movable layer 14 during relaxation to be faster (e.g., by about 100 times) than during actuation.

Figure 13A:
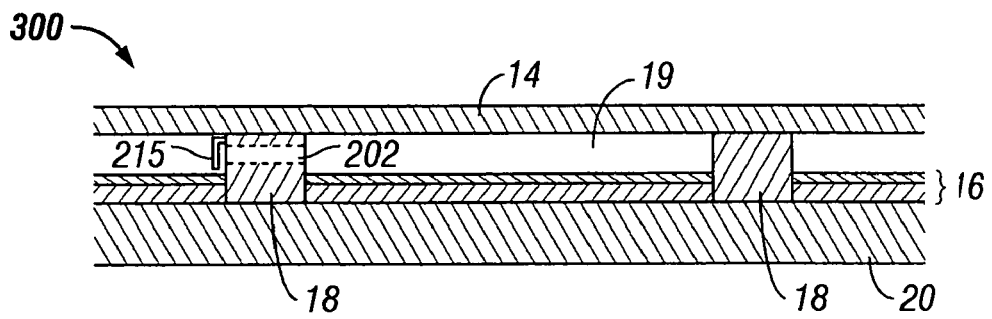
FIG. 13A illustrates an additional alternative embodiment of a MEMS device having a layer movable at asymmetric rates.
Figure 13B:
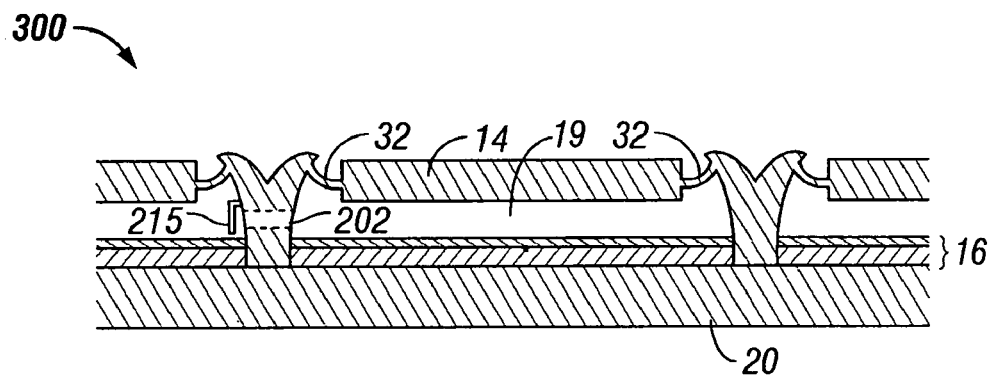
FIG. 13B illustrates yet another alternative embodiment of a MEMS device having a layer movable at asymmetric rates.
Figure 13C:
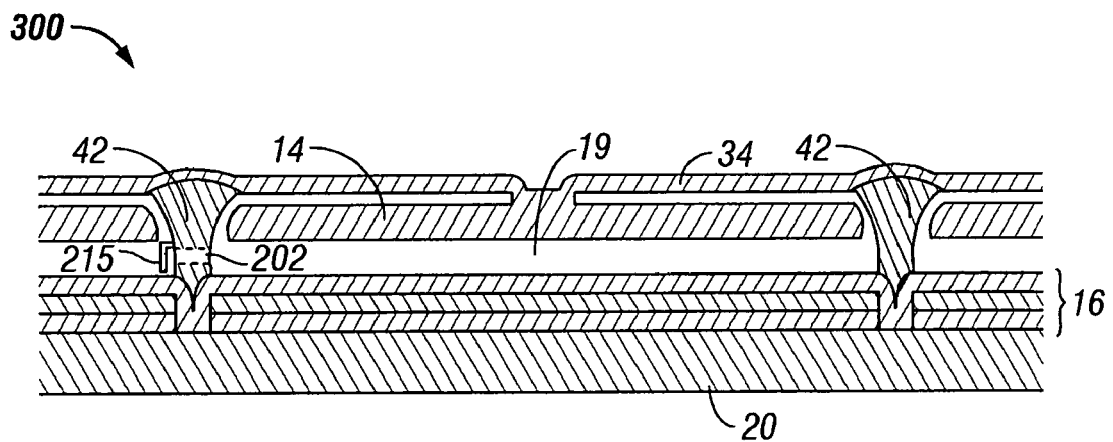
FIG. 13C illustrates still another alternative embodiment of a MEMS device having a layer movable at asymmetric rates

FIGS. 13A through 13C schematically illustrate examples of MEMS devices having at least one aperture 202 through a support structure 18 between the substrate 20 and the movable layer 14. In certain embodiments, the support structure 18 spaces the movable layer 14 from the substrate 20. The support structure 18 may comprise posts or walls. In certain embodiments, the support structure 18 comprises walls that inhibit fluid flow from inside the cavity 19 to outside the cavity 19 during actuation of the movable layer 14.

As shown in FIG. 13A, the support structure 18 further comprises at least one stopple 215 corresponding to the at least one aperture 202 through the support structure 18. Flow of fluid through the aperture 202 may be at least partially restricted or limited by a stopple 215 mechanically coupled to the support structure 18. The stopple 215 may comprise the same material as the support structure 18 or a more flexible material. In certain embodiments, the stopple 215 comprises the same material as the movable layer 14. While FIGS. 13A through 13C show stopples 215 similar to the stopple 210 illustrated in FIG. 1A, in certain other embodiments, stopples 215 similar to those shown in FIGS. 11B through 11H may be used. In certain embodiments, a fluid conductive element comprises the stopple 215 and the aperture 202.

Figure 14A:
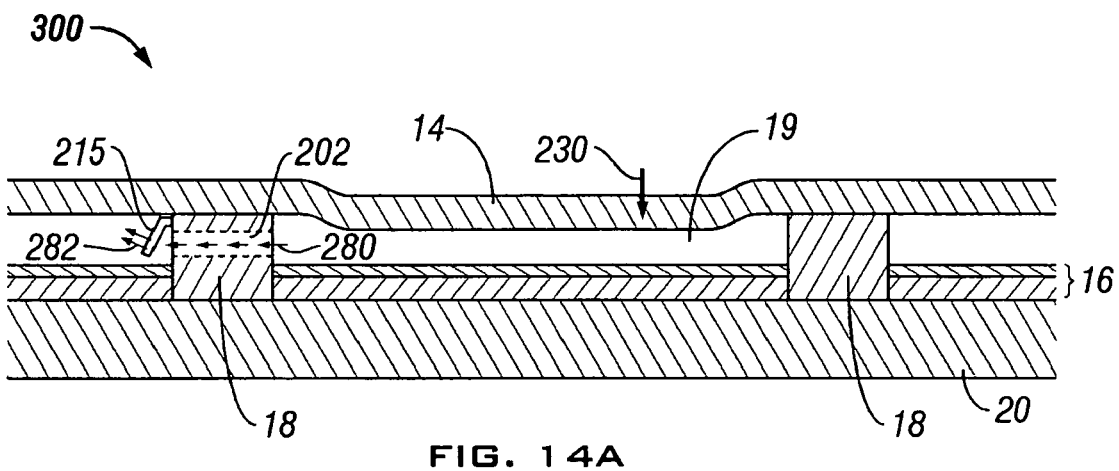
FIG. 14A illustrates a MEMS device having a layer movable at asymmetric rates moving from a second position to a first position.
Figure 14B:
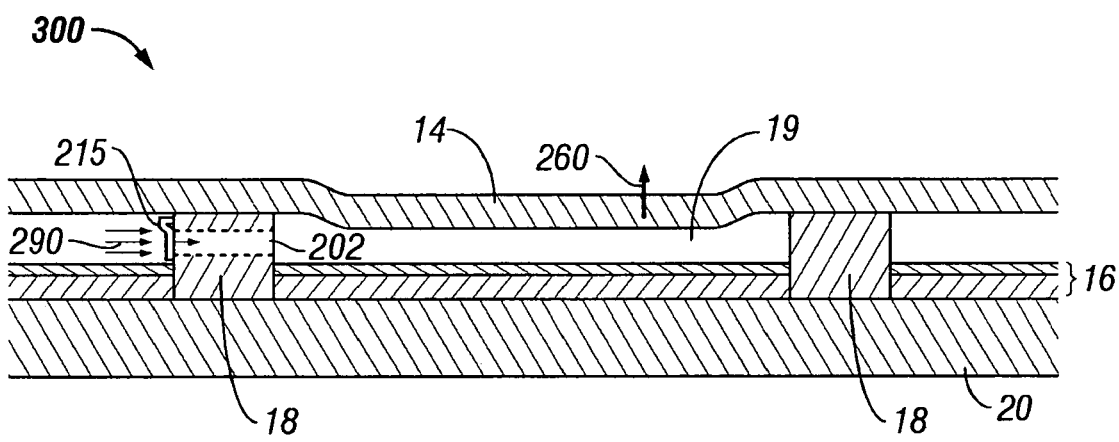
FIG. 14B illustrates a MEMS device having a layer movable at asymmetric rates moving from a first position to a second position.

As schematically illustrated in FIG. 14A, during actuation of the movable layer 14, fluid pressure (shown by arrows 280) from within the cavity 19 displaces the stopple 215 (shown by arrows 282) to provide a pathway for fluid flow from inside the cavity 19 to outside the cavity 19. As schematically illustrated in FIG. 14B, during relaxation of the movable layer 14, fluid pressure (shown by arrows 290) from outside the cavity 19 displaces the stopple 215 to at least partially block fluid flow through the aperture 202 from outside the cavity 19 to inside the cavity 19. Thus, the fluid flowrate into the cavity 19 during relaxation of the movable layer 14 is less than the fluid flowrate out of the cavity 19 during actuation of the movable layer 14. In certain embodiments, the rate of movement of the movable layer 14 is dependent on the rate of fluid flow into and out of the cavity 19, and the difference in fluid flowrates through the aperture 202 during actuation and relaxation can cause the movement of the movable layer 14 to be about 100 times faster during actuation than during relaxation. In other embodiments, the difference in flowrate causes the movement of the movable layer 14 during relaxation to be faster (e.g., by about 100 times) than during actuation.

In some embodiments, the stopple 210 is externally actuated, causing the stopple 210 to move independent of the movement of the movable layer 14. For example, the stopple 210 may be selectively moved to at least partially occlude the aperture 200 or to at least partially clear the aperture 200 by electrostatic forces, magnetic forces, thermoelectric forces, and shape memory alloys regardless of the movement or non-movement of the movable layer 14.

Figure 15A:
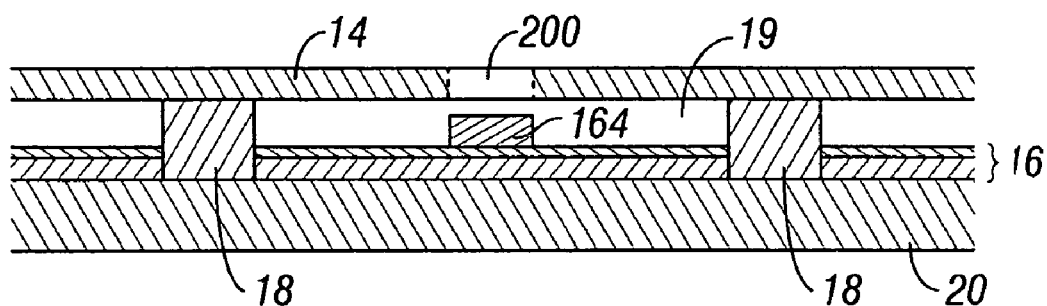
FIG. 15A illustrates an embodiment of a MEMS device having a layer movable at asymmetric rates and a substrate plug.
Figure 15B:
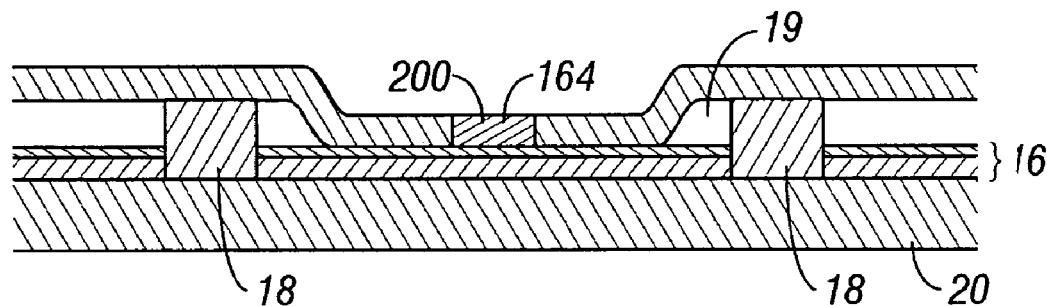
FIG. 15B illustrates an alternative embodiment of a MEMS device having a layer movable at asymmetric rates and a substrate plug.

In certain embodiments, the substrate 20 comprises a plug 164 configured to engage the aperture 200 when the movable layer 14 is in the actuated state, as schematically illustrated by FIGS. 15A and 15B. The plug 164 can be considered to be a stopple 210 that is stationary in relation to the movable layer 14. As shown in FIG. 15A, when the movable layer 14 is not in the actuated state, the plug 164 is separate from the aperture 200 so that fluid can flow through the aperture 200. As shown in FIG. 15B, when the movable layer 14 is in the actuated state, the plug 164 at least partially obstructs fluid flow through the aperture 200. In another embodiment, the plug 164 may be located on the support structure 18 to engage the aperture 200 on the movable layer 14 when the movable layer 14 is in the actuated state. In still another embodiment, the plug 164 may be formed on the movable layer 14 to engage the aperture 202 in the support structure 18 when the movable layer 14 is in the actuated state. In some embodiments, the plug 164 comprises the same material as the substrate 20. In some embodiments, a stopple 210 is used with the aperture 200 and the plug 164, while in other embodiments, no stopple is used with the aperture 200 and the plug 164. Preferably, the plug 164 is short enough that the plug 164 only engages the movable layer 14 when the movable layer 14 is almost fully actuated. In certain embodiments, a fluid conductive element comprises the plug 164 and the aperture 200, 202.

When the movable layer 14 moves from the relaxed state to the actuated state during actuation, the movable layer 14 moves easily through the cavity 19. When the movable layer 14 is in the actuated state, the plug 164 at least partially obstructs the aperture 200 such that fluid flow through the aperture 200 is limited. This restriction of the fluid flow into the cavity 19 and/or friction force between the plug 164 and the movable layer 14 slows the initial movement of the movable layer 14 from the actuated state to the relaxed state. In certain embodiments, the plug 164 contacts the movable layer 14, generating an adhesive force, or "adhesion force," between the movable layer 14 and the plug 164, and thus between the movable layer 14 and the substrate 20. This adhesion force increases the initial force required to move the movable layer 14, and appreciably slows the movable layer 14 as it moves from the relaxed state to the actuated state. In certain embodiments, the plug 164 will cause the movement of the movable layer 14 to be about 100 times faster during actuation than during relaxation. In other embodiments, the plug 164 will cause the movement of the movable layer 14 during relaxation to be faster (e.g., by about 100 times) than during actuation.

Figure 16A:
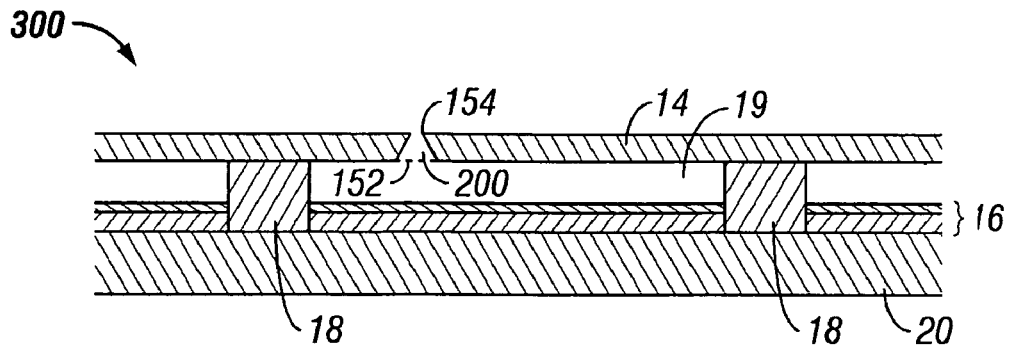
FIG. 16A illustrates an embodiment of a MEMS device having a layer movable at asymmetric rates and an aperture with differing opening areas.
Figure 16B:
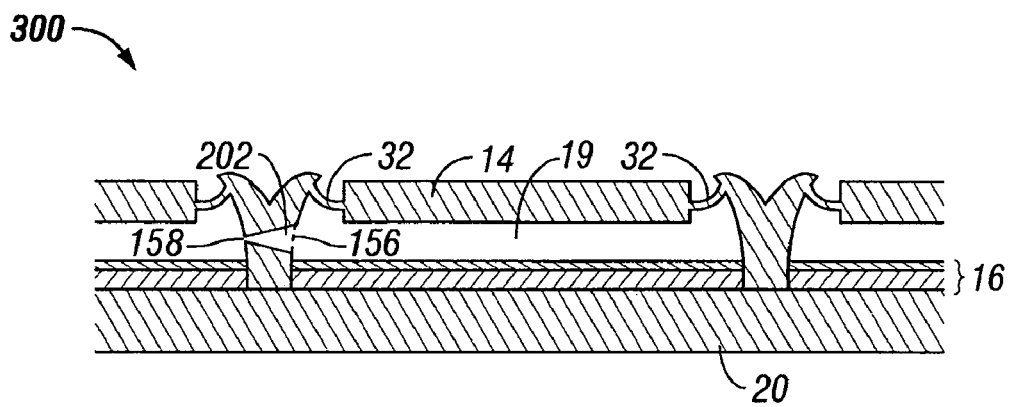
FIG. 16B illustrates an alternative embodiment of a MEMS device having a layer movable at asymmetric rates and an aperture with differing opening areas.
Figure 16C:
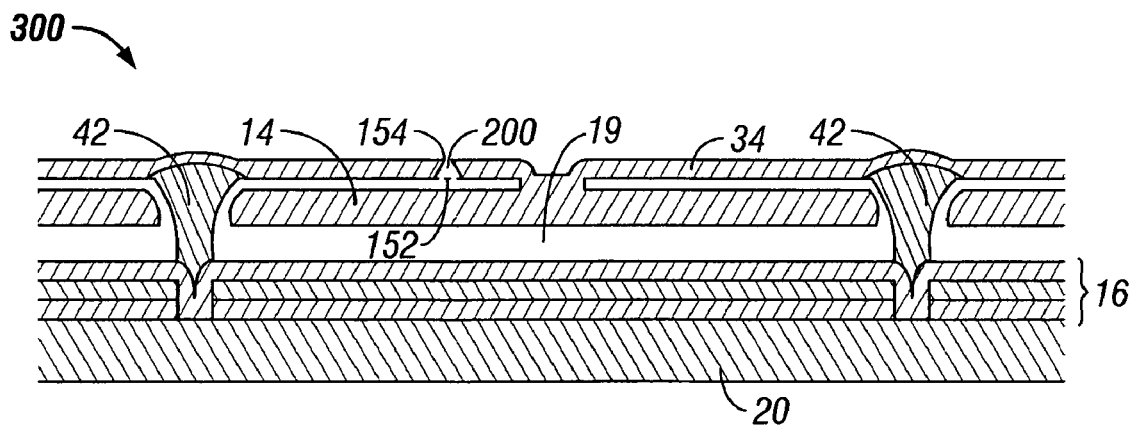
FIG. 16C illustrates another alternative embodiment of a MEMS device having a layer movable at asymmetric rates and an aperture with differing opening areas.

As schematically illustrated in FIGS. 16A through 16C, in certain embodiments, the aperture 200, 202 has a shape that allows fluid to flow easily in one direction but not easily in the opposite direction. The aperture 200 shown in FIG. 16A has a first opening 152 on a surface of the movable layer 14 facing towards the substrate 20 and a second opening 154 on a surface of the movable layer 14 facing away from the substrate 20. The first opening 152 has an area which is larger than the area of the second opening 154. Fluid flow through the aperture 200 is greater in the direction from the first opening 152 to the second opening 154 than in the direction from the second opening 154 to the first opening 152. The aperture 200 may be conical, pyramidal, hemispherical, or any shape where the area of the first opening 152 is larger than the area of the second opening 154. In some embodiments, a stopple 210 is used with the aperture 200 with differing opening areas 152, 154, while in other embodiments, no stopple is used with the aperture 200 with differing opening areas 152, 154. In certain embodiments, the aperture 200 with differing opening areas 152, 154 is on the movable layer 14, as schematically illustrated in FIG. 16A. In other certain embodiments, the aperture 202 with differing opening areas 156, 158 is on the support structure 18, as schematically illustrated in FIG. 16B. In still other certain embodiments, the aperture 200 with differing opening areas 152, 154 is on the deformable layer 34, as schematically illustrated in FIG. 16C. In certain embodiments, a fluid conductive element comprises the aperture 200, 202.

Referring again to FIG. 16A, when the movable layer 14 moves from the relaxed state to the actuated state, fluid within the cavity 19 is compressed and flows out of the cavity 19 through the aperture 200. As the movable layer 14 actuates downward, fluid from within the cavity 19 flows out of the cavity 19 through the available pathways, including through the aperture 200, relatively unimpeded, so the movable layer 14 is not appreciably slowed by the fluid pressure within the cavity 19 when moving from the relaxed state to the actuated state. However, when the movable layer 14 moves from the actuated state to the relaxed state, fluid outside the cavity 19 has only a small area to flow through the aperture 200, so the fluid forces directed against the movement of the movable layer 14 are greater, thereby appreciably slowing the movable layer 14. The shape of the aperture 200 thus inhibits fluid from flowing, into the cavity 19 through the aperture 200.

In some embodiments, the aperture 200 has a first opening on a surface of the movable layer 14 facing towards the substrate 20 which is smaller than a second opening on a surface of the movable layer 14 facing away from the substrate 20. When the movable layer 14 moves from the actuated state to the relaxed state, fluid outside the cavity 19 flows into the cavity 19 through the aperture 200 relatively unimpeded, so the movable layer 14 is not appreciably slowed by the fluid pressure. However, when the movable layer 14 moves from the relaxed state to the actuated state, fluid inside the cavity 19 has only a small area to flow through the aperture 200, so the fluid forces directed against the movable layer 14 are greater, thereby appreciably slowing the movable layer 14. The shape of the aperture 200 thus inhibits fluid from flowing out of the cavity 19 through the aperture 200.

Figure 17A:
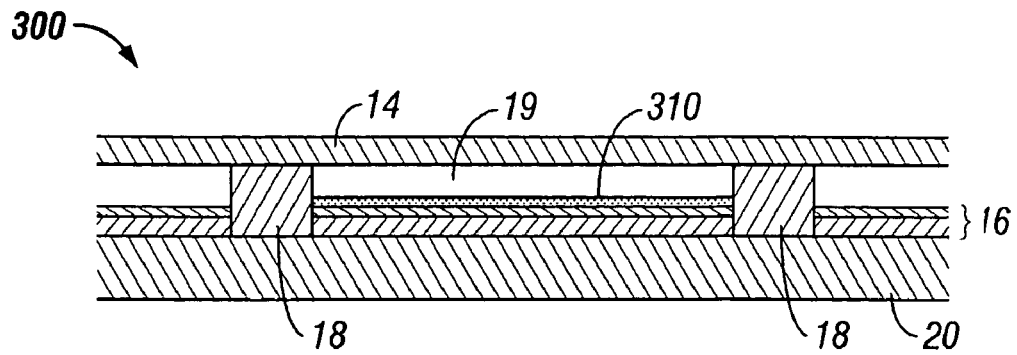
FIG. 17A illustrates an embodiment of a MEMS device having a layer movable at asymmetric rates and an adhesive layer.
Figure 17B:
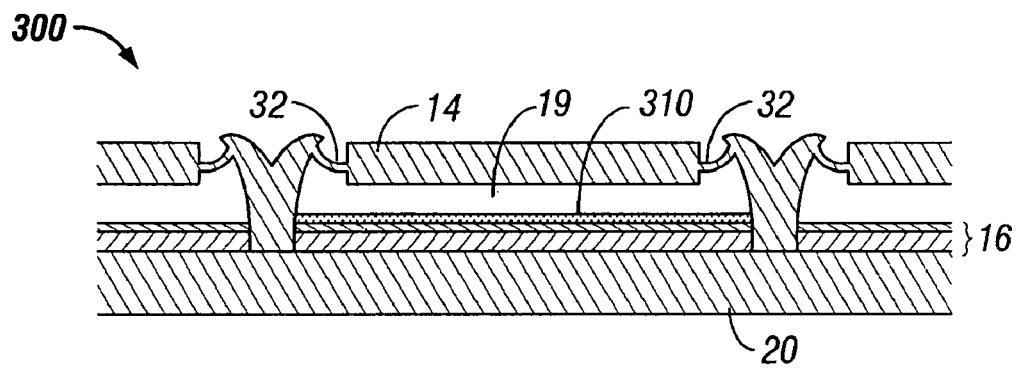
FIG. 17B illustrates an alternative embodiment of a MEMS device having a layer movable at asymmetric rates and an adhesive layer.
Figure 17C:
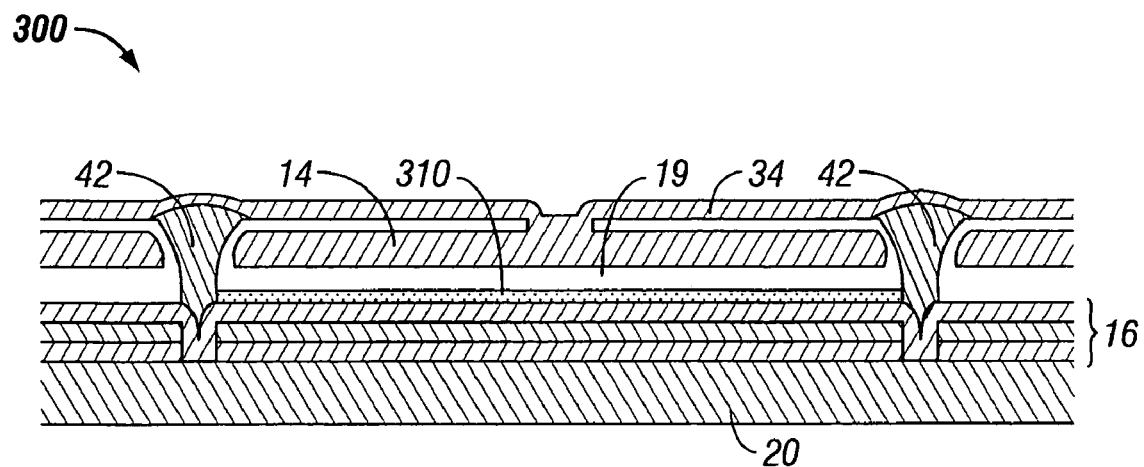
FIG. 17C illustrates another alternative embodiment of a MEMS device having a layer movable at asymmetric rates and an adhesive layer.

FIGS. 17A through 17C show interferometric modulators 300 comprising an adhesive layer 310 between the substrate 20 and the movable layer 14. As shown in FIG. 17A, the adhesive layer 310 may be formed on the surface of the substrate 20 facing the movable layer 14, while in other embodiments the adhesive layer 310 is formed on the surface of the movable layer 14 facing the substrate 20 or on both the surface of the substrate 20 facing the movable layer 14 and the surface of the movable layer 14 facing the substrate 20. The adhesive layer 310 contacts both the substrate 20 and the movable layer 14 when the movable layer 14 is in the actuated state. In certain embodiments in which the movable layer 14 moves from the actuated position to the relaxed position at a rate faster than from the relaxed position to the actuated position, the adhesive layer 310 is formed on the surface of the movable layer 14 facing away from the substrate 20 and that contacts a stationary layer above (i.e., adjacent to or in close proximity with) the movable layer 14 when in the relaxed state. In some embodiments, the adhesive layer 310 may comprise water, an organic material, an inorganic material, a self-assembled monolayer, or any material that will provide adhesion between the substrate 20 and the movable layer 14 when the movable layer 14 is in the actuated state.

In certain embodiments, during fabrication of the interferometric modulator 300, the substrate 20 is processed to produce a substantially smooth surface of the substrate 20 facing the movable layer 14 (e.g., by smoothing the optical stack 16). Examples of processes for smoothing include, but are not limited to, chemical mechanical polishing, electro-chemical etching, dry etching, atomic layer dry etching, etc. In certain embodiments, during fabrication of the interferometric modulator 300, a sacrificial layer is formed over the substrate 20, and the movable layer 14 is formed over the sacrificial layer. The sacrificial layer of certain embodiments is processed to make it smoother (e.g., by chemical mechanical polishing, electro-chemical etching, dry etching, atomic layer dry etching, etc.) prior to formation of the movable layer 14 in order to produce a substantially smooth surface of the movable layer 14 facing the substrate 20. In certain embodiments in which at least one of the substrate 20 or the sacrificial layer is smoothed, the surface area in contact between the movable layer 14 and the substrate 20, and therefore the adhesion force between the substrate 20 and the movable layer 14, is advantageously increased when the movable layer 14 is in the actuated state and the adhesive layer 310 contacts both the substrate 20 and the movable layer 14.

When the movable layer 14 moves from the relaxed state to the actuated state during actuation, the movable layer 14 moves easily through the cavity 19. When the movable layer 14 is in the actuated state, the adhesive layer 310 contacts both the movable layer 14 and the substrate 20, generating an adhesion force between the movable layer 14 and the substrate 20. This adhesion force increases the initial force required to move the movable layer 14, and appreciably slows the movable layer 14 as it moves from the actuated state to the relaxed state. In certain embodiments, the adhesion force from the adhesive layer 310 will cause the movement of the movable layer 14 to be about 100 times faster during actuation than during relaxation. In other embodiments, the adhesion force will cause the movement of the movable layer 14 during relaxation to be faster (e.g., by about 100 times) than during actuation.

As described above, in some embodiments, the movable layer 14 moves in response to a voltage applied between a first electrode 182 and a second electrode 184. When a potential difference is applied to a selected row and column, the capacitor formed at the intersection of the row and column electrodes, and the corresponding pixel, becomes charged, and electrostatic forces pull the movable layer 14 towards the substrate 20, as schematically illustrated by arrows 181 in FIGS. 18A and 18B. If the voltage is high enough, the movable layer 14 is deformed and is forced against the substrate 20. A dielectric layer within the substrate 20 may be used to prevent shorting and to control the separation distance between the movable layer 14 and the substrate 20. The behavior of the movable layer 14 is the same regardless of the polarity of the applied potential difference between the first electrode 182 and second electrode 184.

Figure 18A:
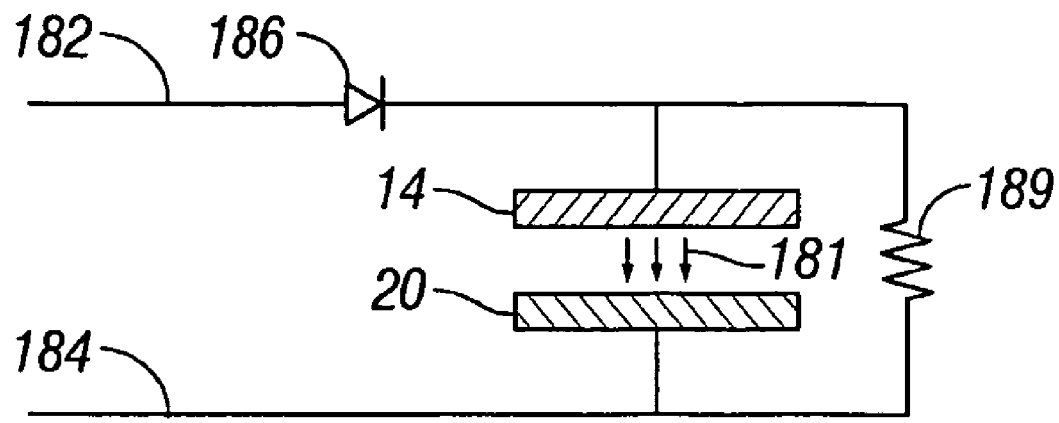
FIG. 18A illustrates an embodiment of a MEMS device having a layer movable at asymmetric rates and a diode.
Figure 18B:
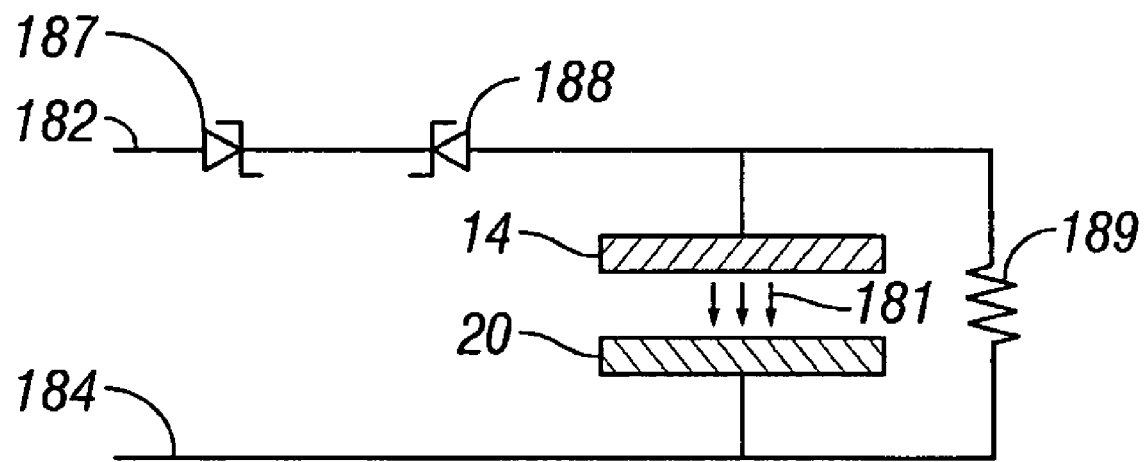
FIG. 18B illustrates an embodiment of a MEMS device having a layer movable at asymmetric rates and a zener diode.

In some embodiments, as schematically illustrated in FIG. 18A, the first electrode 182 is configured to communicate with a diode 186 and a leakage resistor 189 is configured to be in parallel with the capacitor formed by the device. The diode 186 operates as a check valve. If the column voltage is brought to a high voltage, the capacitor formed by the device will charge to the applied voltage minus the diode voltage (e.g., 0.6 volts) by charge flowing from the column wire to the capacitor. When the column voltage is brought back down to a lower voltage, the diode 186 stops the flow of charge from the capacitor back through the column wire. Instead, the capacitor charge will gradually dissipate through the leakage resistor 189. In this way, the actuation rate and the relaxation rate can be tailored to be different from one another.

In certain embodiments, the first electrode 182 is configured to communicate with zener diodes 187 and 188. Unlike the diode 186, the zener diodes 187, 188 permit current to flow in the reverse direction if the voltage is larger than the breakdown voltage. Placing two zener diodes 187, 188 in series and oriented opposite one another allows both voltage polarities to be applied to the columns. When a positive voltage is applied to the pixel, the zener diode 187 allows current to flow from the first electrode 182 to the capacitor and the zener diode 188 breaks down, also allowing current to flow from the first electrode 182 to the capacitor. When a negative voltage is applied to the pixel, the zener diode 188 allows current to flow from the capacitor to the first electrode 182 and the zener diode 187 breaks down, also allowing current to flow from the capacitor to the first electrode 182. When no voltage is applied to the pixel, the zener diodes 187, 188 block the flow of charge from the capacitor back through the column wire without breaking down. Instead, the capacitor charge will gradually dissipate through the leakage resistor 189.

Manipulation of the mechanical persistence of the movable layer allows an interferometric modulator to be operated without using the hysteresis property of the modulator (illustrated in FIGS. 3 through 5 and 19). Instead, the processes and systems described herein may be used with row/column actuation protocols that maintain voltages to the MEMS interferometric modulators that are above or below the "hysteresis window" or the "stability window." These protocols may advantageously operate the MEMS interferometric modulator at lower voltages than the voltages employed with the processes and systems described with reference to FIGS. 3 through 5. Examples of such actuation protocols are described in U.S. patent application Ser. No. 11/112,487, entitled "Device and Method for Display Memory Using Manipulation of Mechanical Response," filed Apr. 22, 2005, incorporated by reference herein in its entirety.

Figure 19A:
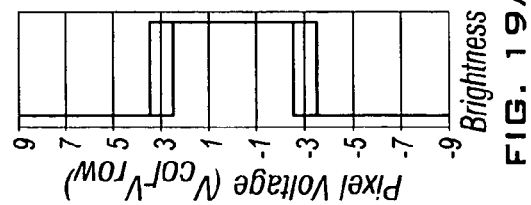
FIGS. 19A-19E illustrate an example of an asymmetric rate protocol in contrast with a hysteresis drive scheme for an example pixel of an interferometric modulator display device.

FIGS. 19A-19E illustrate an example of an asymmetric rate protocol in contrast with a hysteresis drive scheme for an example pixel of an interferometric modulator display device. FIG. 19A illustrates an example of a hysteresis curve of the example pixel. The horizontal axis of FIG. 19A corresponds to the brightness of the pixel and the vertical axis corresponds to the applied pixel voltage, which is the voltage difference between the column voltage and the row voltage of the pixel. FIG. 19A illustrates that when the magnitude of the pixel voltage is changed from below about 3.5 volts to above about 3.5 volts, the movable layer of the pixel moves from the relaxed state to the actuated state, thereby changing the brightness of the pixel from high brightness to low brightness. FIG. 19A further illustrates that when the magnitude of the pixel voltage is changed from above about 2.5 volts to below about 2.5 volts, the movable layer of the pixel moves from the actuated state to the relaxed state, thereby changing the brightness of the pixel from low brightness to high brightness. The "hysteresis window" of the pixel is the voltage range between the voltages that cause actuation and relaxation of the movable layer, illustrated in FIG. 19A to be between about +2.5 volts and +3.5 volts and between about −2.5 volts and −3.5 volts.

Figure 19B:
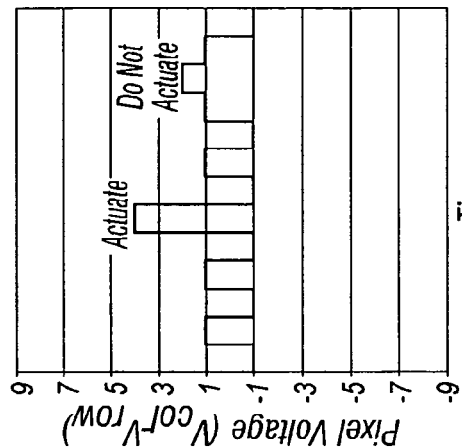

FIG. 19B illustrates an example of a series of pixel voltages which can be used to actuate and release the example pixel having the hysteresis curve of FIG. 19A. FIG. 19C illustrates an example of a series of column voltages and row voltages corresponding to the pixel voltages of FIG. 19B. The horizontal axes of FIGS. 19B and 19C correspond to time and the vertical axes of FIGS. 19B and 19C correspond to pixel voltage and column/row voltages, respectively. As illustrated in FIG. 19B, the pixel voltage is selectively switched between −3 and +3 volts for two cycles (e.g., by switching the column voltage between +6 volts and 0 volts while the row voltage remains at about +3 volts). The magnitudes of these pixel voltages are insufficient to switch the example pixel between the actuated and relaxed states, as shown in the hysteresis curve of FIG. 19A, so the example pixel remains unaffected. During these cycles, the column voltage is used in actuating or releasing other pixels of the display device sharing the same column voltage of the example pixel.

When the example pixel is to be actuated, the column voltage is switched to about +6 volts and the row voltage is switched to about 0 volts, resulting in a pixel voltage of about +6 volts. Because this pixel voltage is greater than the actuation voltage of +3.5 volts, as shown in FIG. 19A, the movable layer of the example pixel is actuated. The pixel voltage of FIG. 19B then continues to alternate between −3 and +3 volts for another two cycles (e.g., by switching the column voltage between +6 volts and 0 volts while the row voltage remains at about +3 volts). Again, the magnitudes of these pixel voltages are insufficient to switch the example pixel, so the example pixel remains in the actuated state while the column voltage is used in actuating or releasing other pixels of the display device sharing the same column voltage of the example pixel.

When the example pixel is to be relaxed, the column voltage is switched to about 0 volts and the row voltage is switched to about 0 volts, resulting in a pixel voltage of about 0 volts. Because this pixel voltage is less than the relaxation voltage of +2.5 volts, as shown in FIG. 19A, the movable layer of the example pixel is relaxed. The pixel voltage can then continue to alternate between −3 and +3 volts until the example pixel is to be actuated again.

For a hysteresis drive scheme (e.g., as shown in FIGS. 19A-19C), a static image only has to be written once, and it can then be held indefinitely. However, for displaying video images which change over time, the display must be continuously updated. Because power is proportional to the square of the voltage, the relatively large switches of the column voltage of a hysteresis drive scheme (e.g., between +6 volts and 0 volts shown in FIG. 19C) correspond to substantial power consumption. The power used to change the columns is much larger than the power to change the rows because each row changes only once per display frame, while each column changes once for every row change.

Figure 19D:
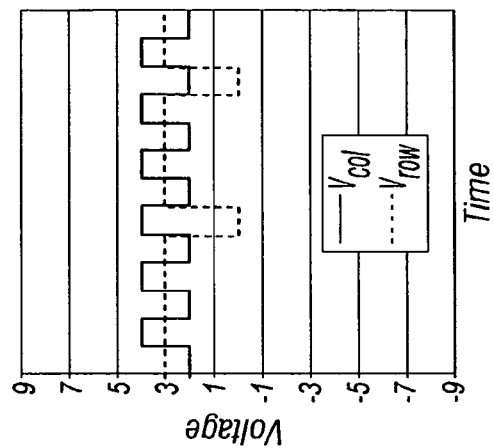
Figure 19C:
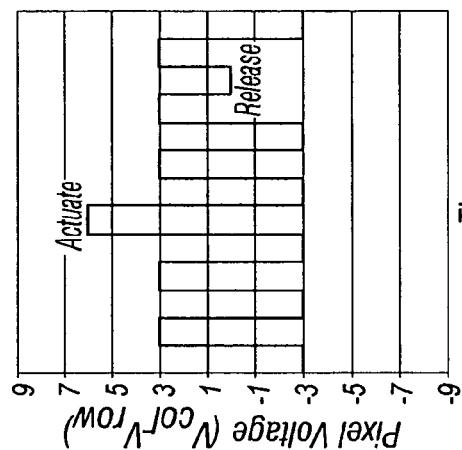
Figure 19E:
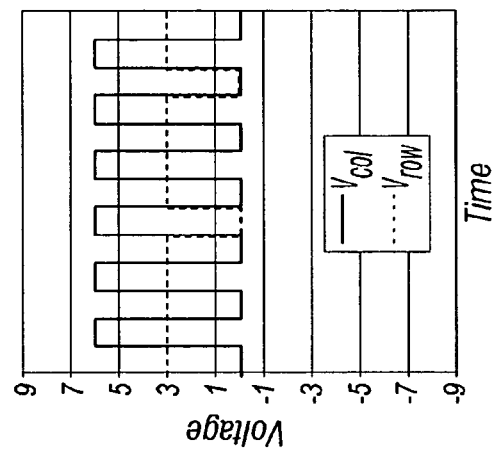

FIGS. 19D and 19E illustrate an example of a series of pixel voltages and column/row voltages, respectively, which can be used to actuate and release an example pixel which does not have a hysteresis curve, but which has an asymmetric rate. The horizontal axes of FIGS. 19D and 19E correspond to time and the vertical axes of FIGS. 19D and 19E correspond to pixel voltage and column/row voltages, respectively. In certain embodiments, an asymmetric protocol is similar to the drive scheme used for STN LCD display devices.

In the example asymmetric protocol of FIGS. 19D and 19E, while the example pixel can be actuated by applying a pixel voltage having a magnitude greater than about +3.5 volts (actuation voltage) and can be relaxed by applying a pixel voltage having a magnitude less than about +3.5 volts, the rate of actuation upon applying the actuation voltage is faster than the rate of relaxation upon applying a voltage less than the actuation voltage. Since the example pixel does not have a hysteresis curve, the example pixel begins to relax as soon as the pixel voltage is less than the actuation voltage. However, since the rate of relaxation is relatively slow, while the example pixel begins to relax immediately once the pixel voltage is less than the actuation voltage, the example pixel does not completely relax until a period of time has elapsed. This period of time can be approximately equal to the time period between column/row voltage pulses (e.g., the time period of voltage cycles), or the period of time can be greater than the time period of voltage cycles (e.g., approximately equal to the time period of two or more voltage cycles).

As illustrated in FIG. 19D, the pixel voltage is selectively switched between −1 and +1 volts for two cycles (e.g., by switching the column voltage between about +2 volts and +4 volts while the row voltage remains at about +3 volts). The magnitudes of these pixel voltages are insufficient to actuate the example pixel, so the example pixel is unaffected by these pixel voltages. During these cycles, the column voltage is used in actuating other pixels of the display device sharing the same column voltage of the example pixel.

When the example pixel is to be actuated, the column voltage is switched to about +4 volts and the row voltage is switched to about 0 volts, resulting in a pixel voltage of about +4 volts. Because this pixel voltage is greater than the actuation voltage of +3.5 volts, the movable layer of the example pixel is actuated. The pixel voltage of FIG. 19D then continues to alternate between −1 and +1 volts for another two cycles (e.g., by switching the column voltage between +4 volts and +2 volts while the row voltage remains at +3 volts). Again, the magnitudes of these pixel voltages are less than the actuation voltage of the example pixel, so the example pixel relaxes during these cycles. To keep the example pixel in the actuated state for another cycle, the pixel voltage is again selected to be greater than the actuation voltage.

For the example asymmetric protocol of FIGS. 19D and 19E, the example pixel begins to relax once the pixel voltage is less than the actuation voltage. Thus, the example pixel can be in the relaxed state at a selected moment once a sufficient amount of time has elapsed from the immediately preceding application of a pixel voltage greater than the actuation voltage. For example, as shown in FIG. 19D, for a rate of relaxation in which the pixel takes about three voltage cycles to switch from the actuated state to the relaxed state, the pixel voltage remains below the actuation voltage of +3.5 volts for three cycles prior to the moment when the example pixel is to be in the relaxed state. Even when the pixel voltage is about +2 volts (e.g., by switching the column voltage to +2 volts and switching the row voltage to about 0 volts), the pixel voltage is less than the actuation voltage, and the movable layer in the pixel continues to slowly return to the relaxed state. To actuate the example pixel, the pixel voltage is again selected to be greater than the actuation voltage.

Because the switches of the column voltage (e.g., between +4 volts and +2 volts) for the asymmetric protocol can be substantially less than for the hysteresis drive scheme (e.g., between +6 volts and 0 volts as described above), certain embodiments utilizing the asymmetric protocol advantageously provide substantial energy savings over the hysteresis drive scheme. For an asymmetric protocol (e.g., as shown in FIGS. 19D and 19E), a static image has to be continuously updated, as do video images that change over time. While the continual updating of static images reduces the energy savings gained by utilizing the asymmetric protocol rather than the hysteresis drive scheme, the asymmetric protocol of certain embodiments can provide substantial power reductions for changing video images that have to be updated for both drive schemes.

Various specific embodiments have been described above. Although the invention has been described with reference to these specific embodiments, the descriptions are intended to be illustrative of the invention and are not intended to be limiting. Various modifications and applications may occur to those skilled in the art without departing from the true scope of the invention as defined in the appended claims.

What is claimed is:

1. A microelectromechanical (MEMS) device comprising:
   a substrate;
   a movable layer mechanically coupled to the substrate, the movable layer movable between a first position and a second position, wherein the movable layer is configured to move from the first position to the second position at a first rate and wherein the movable layer is configured to move from the second position to the first position at a second rate that is faster than the first rate;
   a cavity defined between the substrate and the movable layer, the cavity containing a fluid; and
   a fluid conductive element through which the fluid is configured to flow at a first flowrate from inside the cavity to outside the cavity upon movement of the movable layer from the second position to the first position and through which the fluid is configured to flow at a second flowrate from outside the cavity to inside the cavity upon movement of the movable layer from the first position to the second position, the second flowrate slower than the first flowrate, wherein the fluid conductive element comprises at least one aperture through the movable layer, wherein the fluid conductive element further comprises at least one stopple that at least partially restricts fluid flow through the aperture.

2. The MEMS device of claim 1, wherein the second rate is about 100 times faster than the first rate.

3. The MEMS device of claim 1, wherein the second position is further from the substrate than is the first position.

4. The MEMS device of claim 1, wherein the MEMS device is substantially reflective to incident light when the movable layer is in the first position and wherein the MEMS device is substantially non-reflective to incident light when the movable layer is in the second position.

5. The MEMS device of claim 1, further comprising a partially reflective layer between the substrate and the movable layer.

6. The MEMS device of claim 1, wherein the fluid comprises air.

7. The MEMS device of claim 1, wherein the fluid comprises water.

8. The MEMS device of claim 1, wherein the at least one aperture comprises a first opening area on a surface of the movable layer facing towards the substrate and a second opening area on a surface of the movable layer facing away from the substrate, the second opening area smaller than the first opening area.

9. The MEMS device of claim 1, wherein the at least one stopple comprises a flap at least partially covering the aperture.

10. The MEMS device of claim 1, wherein the at least one stopple comprises flexible material.

11. The MEMS device of claim 1, further comprising at least one plug on the substrate, wherein the plug restricts fluid flow through the at least one aperture when the movable layer is in the first position, wherein the first position is closer to the substrate than is the second position.

12. The MEMS device of claim 11, wherein the plug and the substrate comprise the same material.

13. The MEMS device of claim 11, wherein the plug is coupled to the at least one aperture when the movable layer is in the first position.

14. The MEMS device of claim 1, further comprising a support structure between the movable layer and the substrate.

15. The MEMS device of claim 14, wherein the support structure includes at least one wall surrounding the cavity, the at least one wall configured to inhibit fluid flow between inside the cavity and outside the cavity.

16. The MEMS device of claim 14, wherein the fluid conductive element comprises at least one aperture through the support structure.

17. The MEMS device of claim 16, wherein the at least one aperture through the support structure comprises a first opening area on a surface of the support structure layer facing towards the cavity and a second opening area on a surface of the support structure facing away from the cavity, the second opening area smaller than the first opening area.

18. The MEMS device of claim 16, wherein the fluid conductive element comprises at least one stopple of the at least one aperture that at least partially restricts fluid flow through the at least one aperture through the support structure.

19. The MEMS device of claim 18, wherein the at least one stopple of the at least one aperture comprises a flap at least partially covering the at least one aperture through the support structure.

20. The MEMS device of claim 18, wherein the at least one stopple comprises flexible material.

21. The MEMS device of claim 14, wherein the fluid conductive element comprises at least one plug on the support structure corresponding to the at least one aperture through the movable layer, wherein the plug restricts fluid flow through the at least one aperture when the movable layer is in the first position, wherein the first position is closer to the substrate than is the second position.

22. The MEMS device of claim 21, wherein the plug and the support structure comprise the same material.

23. The MEMS device of claim 14, wherein the fluid conductive element comprises at least one aperture through the support structure and at least one corresponding plug on the movable layer, wherein the plug restricts fluid flow through the at least one aperture through the support structure when the movable layer is in the first position, wherein the first position is closer to the substrate than is the second position.

24. The MEMS device of claim 1, further comprising:
   a display;
   a processor in electrical communication with the display, the processor configured to process image data; and
   a memory device in electrical communication with the processor.

25. The MEMS device of claim 24, further comprising a driver circuit configured to send at least one signal to the display.

26. The MEMS device of claim 25, wherein the driver circuit is compatible with a super twisted nematic (STN) display.

27. The MEMS device of claim 25, wherein the driver circuit is configured to refresh the display at a frequency greater than about once per 30 milliseconds.

28. The MEMS device of claim 1, wherein the device has a first reflectivity when the movable layer is in the first position and a second reflectivity when the movable layer is in the second position, the first reflectivity different than the second reflectivity.

29. The MEMS device of claim 1, wherein the device comprises a spatial light modulator.

30. The MEMS device of claim 1, wherein the device comprises an optical modulator.

* * * * *

UNITED STATES PATENT AND TRADEMARK OFFICE
CERTIFICATE OF CORRECTION

PATENT NO. : 7,550,810 B2 Page 1 of 1
APPLICATION NO. : 11/360162
DATED : June 23, 2009
INVENTOR(S) : Marc Mignard et al.

It is certified that error appears in the above-identified patent and that said Letters Patent is hereby corrected as shown below:

On the Title Page at Item (56), Page 4, Col. 2, Line 24, under U.S. Patent Documents, change "Pichi et al." to --Piehl et al.--.

On the Title Page at Item (56), Page 4, Col. 2, Line 25, under U.S. Patent Documents, change "Piehi et al." to --Piehl et al.--.

On the Title Page at Item (56), Page 5, Col. 2, Line 29, under Other Publications, change "curcuit" to --circuit--.

On the Title Page at Item (56), Page 5, Col. 2, Line 35, under Other Publications, change "Quanum" to --Quantum--.

On the Title Page at Item (56), Page 5, Col. 2, Line 45, under Other Publications, change "Piscatawny" to --Piscataway--.

On the Title Page at Item (56), Page 6, Col. 1, Line 10, under Other Publications, change "Piscatawny" to --Piscataway--.

On the Title Page at Item (56), Page 6, Col. 2, Line 25, under Other Publications, change "Michromachined" to --Micromachined--.

On the Title Page at Item (56), Page 6, Col. 2, Line 37, under Other Publications, change "Liquivista" to --Liquavista--.

At Column 1, Line 65, change "flowrate" to --flowrate.--.

At Column 4, Line 19, change "rates" to --rates.--.

At Column 18, Line 59, change "1A," to --11A,--.

Signed and Sealed this

Fifteenth Day of June, 2010

David J. Kappos
*Director of the United States Patent and Trademark Office*